United States Patent
Kawata

(10) Patent No.: US 7,395,519 B2
(45) Date of Patent: Jul. 1, 2008

(54) ELECTRONIC-CIRCUIT ANALYSIS PROGRAM, METHOD, AND APPARATUS FOR WAVEFORM ANALYSIS

(75) Inventor: Hikoyuki Kawata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 83 days.

(21) Appl. No.: 11/259,273

(22) Filed: Oct. 27, 2005

(65) Prior Publication Data

US 2007/0006104 A1 Jan. 4, 2007

(30) Foreign Application Priority Data

Jun. 30, 2005 (JP) ............................. 2005-191544

(51) Int. Cl.
*G06F 17/50* (2006.01)
(52) U.S. Cl. ............... 716/4; 716/5; 716/6; 703/14; 703/19
(58) Field of Classification Search .............. 716/8, 716/4–6; 703/14, 19
See application file for complete search history.

(56) References Cited

U.S. PATENT DOCUMENTS

| | | | | |
|---|---|---|---|---|
| 5,508,937 A | * | 4/1996 | Abato et al. ................... | 716/6 |
| 5,751,593 A | * | 5/1998 | Pullela et al. ................... | 716/6 |
| 6,041,170 A | * | 3/2000 | Feldmann et al. ............... | 703/2 |
| 6,209,122 B1 | * | 3/2001 | Jyu et al. ........................ | 716/6 |
| 6,230,302 B1 | * | 5/2001 | Gabele et al. ................... | 716/6 |
| 6,374,204 B1 | * | 4/2002 | Mandell et al. ................ | 703/14 |
| 6,493,853 B1 | * | 12/2002 | Savithri et al. .................. | 716/5 |
| 6,578,181 B2 | * | 6/2003 | Hisada et al. ................... | 716/5 |
| 2003/0009733 A1 | * | 1/2003 | Hathaway et al. .............. | 716/6 |
| 2005/0039152 A1 | * | 2/2005 | Kidd et al. ...................... | 716/6 |

FOREIGN PATENT DOCUMENTS

JP 10-21267 1/1998

\* cited by examiner

*Primary Examiner*—Paul Dinh
*Assistant Examiner*—Nha Nguyen
(74) *Attorney, Agent, or Firm*—Staas & Halsey LLP

(57) ABSTRACT

A design-change-target-circuit detecting unit inputs circuit information including an element model describing an electronic circuit to detect an electronic circuit using a changed element model. A determining unit compares a characteristic of an element model before change and that of the element model after change. An analysis-necessity deciding unit decides whether waveform analysis is necessary, and when determining that waveform analysis is necessary, makes an instruction for waveform analysis of the electronic circuit using the element model after change. Furthermore, after the determination-necessity deciding unit determines that waveform analysis of the electronic circuit using the element model after change is not necessary and design requirement conditions of the electronic circuit including the element model after change are changed from those before change, an instruction for pass/fail determination as to whether existing waveform analysis results satisfy the design requirement conditions after change is made to cause the instruction to be executed.

17 Claims, 22 Drawing Sheets

| PARAMETERS REGARDING CHARACTERISTICS | | | |
|---|---|---|---|
| PARAMETER | EXAMPLE OF VALUE | | DESCRIPTION |
| Voltage Range | 3.3V | | POWER SUPPLY VOLTAGE |
| C_comp | 3pF | | SILLICON DIE CAPACITANCE |
| Pullup | V<br>−3.3<br>−0.5<br>−0.2<br>0.1<br>0.4<br>0.7<br>1.0<br>1.3<br>1.6<br>1.9<br>2.2<br>2.5<br>2.8<br>3.1<br>6.6 | I<br>0.01591<br>0.01338<br>0.00515<br>−0.00244<br>−0.00914<br>−0.01486<br>−0.01953<br>−0.02308<br>−0.02542<br>−0.02673<br>−0.02766<br>−0.02830<br>−0.02872<br>−0.02900<br>−0.03204 | VOLTAGE/CURRENT CHARACTERISTIC OF Pullup |
| Pulldown | V<br>−3.3<br>−0.5<br>−0.2<br>0.1<br>0.4<br>1.0<br>2.5<br>3.1<br>6.6 | I<br>−0.02767<br>−0.02354<br>−0.00947<br>0.00452<br>0.01617<br>0.02720<br>0.03174<br>0.03202<br>0.03400 | VOLTAGE/CURRENT CHARACTERISTIC OF Pulldown |

| GND Clamp | V | I | VOLTAGE/CURRENT CHARACTERISTIC OF GND Clamp |
|---|---|---|---|
| | −3.30 | −4.40 | |
| | −2.90 | −3.66 | |
| | −2.40 | −2.75 | |
| | −1.90 | −1.83 | |
| | −1.40 | −0.93 | |
| | −0.90 | −0.11 | |
| | 0 | 0.00 | |
| POWER Clamp | −3.30 | 0.90660 | VOLTAGE/CURRENT CHARACTERISTIC OF POWER Clamp |
| | −3.1 | 0.83160 | |
| | −2.8 | 0.71930 | |
| | −2.5 | 0.60720 | |
| | −2.2 | 0.49540 | |
| | −1.90 | 0.38410 | |
| | −1.6 | 0.27360 | |
| | −1.3 | 0.16480 | |
| | −1.0 | 0.06106 | |
| | −0.7 | 0.00356 | |
| | 0 | 0 | |
| TR | 0.2[nec] | | RISE TIME |
| TF | 0.2[nec] | | FALL TIME |
| R_load | 50ohm | | LOAD RESISTANCE |
| Vmeas | 1.5V | | TIMING MEASUREMENT VOLTAGE |
| PARAMETER REGARDING DETERMINATION | | | |
| TPD_MIN | 1.5[nsec] | | MINIMUM VALUE OF TIME FROM CLOCK INPUT TO DATA OUTPUT |
| TPD_MAX | 2.0[nsec] | | MAXIMUM VALUE OF TIME FROM CLOCK INPUT TO DATA OUTPUT |

| PARAMETERS REGARDING DETERMINATION | | |
|---|---|---|
| PARAMETER | EXAMPLE OF VALUE | DESCRIPTION |
| Voltage Range | 3.3V | POWER SUPPLY VOLTAGE |
| C_comp | 3pF | INPUT/OUTPUT CAPACITY |
| GND Clamp | V    I<br>−3.30  −4.40<br>−2.90  −3.66<br>−2.40  −2.75<br>−1.90  −1.83<br>−1.40  −0.93<br>−0.90  −0.11<br>0    0.00 | VOLTAGE/CURRENT CHARACTERISTIC OF GND Clamp |
| POWER Clamp | −3.30  0.90660<br>−3.1   0.83160<br>−2.8   0.71930<br>−2.5   0.60720<br>−2.2   0.49540<br>−1.90  0.38410<br>−1.6   0.27360<br>−1.3   0.16480<br>−1.0   0.06106<br>−0.7   0.00356<br>0    0 | VOLTAGE/CURRENT CHARACTERISTIC OF POWER Clamp |
| PARAMETER REGARDING DETERMINATION | | |
| VIL | 0.8V | THRESHOLD VOLTAGE AT LOW SIDE |
| Vth | 1.2V | THRESHOLD VOLTAGE |
| VIH | 1.6V | THRESHOLD VOLTAGE AT HIGH SIDE |
| Overshoot | 4.3V | OVERSHOOT VOLTAGE |
| Undershoot | −1V | UNDERSHOOT VOLTAGE |
| Setup Time | 1[nsec] | SETUP TIME |
| Hold Time | 1[nsec] | HOLD TIME |

FIG. 17

| FREQUENCY | V-I CHARACTERISTIC |
|---|---|
| 1Hz~10MHz | SIMILARITY IS EQUAL TO OR LARGER THAN 90% IN RANGE OF 0V TO POWER SUPPLY VOLTAGE AND IN RANGE WHERE ABSOLUTE VALUE OF CURRENT IS EQUAL TO OR SMALLER THAN 100mA, AND SIMILARITY IS EQUAL TO OR LARGER THAN 80% UNDER CONDITIONS OTHERWISE |
| 10MHz~100MHz | SIMILARITY IS EQUAL TO OR LARGER THAN 95% IN RANGE OF 0V TO POWER SUPPLY VOLTAGE AND IN RANGE WHERE ABSOLUTE VALUE OF CURRENT IS EQUAL TO OR SMALLER THAN 100mA, AND SIMILARITY IS EQUAL TO OR LARGER THAN 90% UNDER CONDITIONS OTHERWISE |
| 100MHz~300MHz | SIMILARITY IS EQUAL TO OR LARGER THAN 99% IN RANGE OF 0V TO POWER SUPPLY VOLTAGE AND IN RANGE WHERE ABSOLUTE VALUE OF CURRENT IS EQUAL TO OR SMALLER THAN 100mA, AND SIMILARITY IS EQUAL TO OR LARGER THAN 95% UNDER CONDITIONS OTHERWISE |

| FREQUENCY | TRANSIENT-CHARACTERISTIC VOLTAGE AXIS |
|---|---|
| 1Hz~10MHz | ERROR IS WITHIN 50mV IN ALL ELEMENTS IN CIRCUIT. VALUE OF SUM OF MAX VALUES OF VOLTAGE ERROR IS WITHIN 100mV FOR ALL ELEMENTS IN CIRCUIT. ALLOWABLE TIME IS WITHIN 1000ps IN ALL ELEMENTS IN CIRCUIT HAVE. VALUE OF SUM OF MAX VALUES OF ALLOWABLE TIME IS WITHIN 1000ps FOR ALL ELEMENTS IN CIRCUIT. |
| 10MHz~100MHz | ERROR IS WITHIN 20mV IN ALL ELEMENTS IN CIRCUIT. VALUE OF SUM OF MAX VALUES OF VOLTAGE ERROR IS WITHIN 50mV FOR ALL ELEMENTS IN CIRCUIT. ALLOWABLE TIME IS WITHIN 100ps IN ALL ELEMENTS IN CIRCUIT HAVE. VALUE OF SUM OF MAX VALUES OF ALLOWABLE TIME IS WITHIN 100ps FOR ALL ELEMENTS IN CIRCUIT. |
| 100MHz~300MHz | ERROR IS WITHIN 10mV IN ALL ELEMENTS IN CIRCUIT. VALUE OF SUM OF MAX VALUES OF VOLTAGE ERROR IS WITHIN 20mV FOR ALL ELEMENTS IN CIRCUIT. ALLOWABLE TIME IS WITHIN 10ps IN ALL ELEMENTS IN CIRCUIT HAVE. VALUE OF SUM OF MAX VALUES OF ALLOWABLE TIME IS WITHIN 10ps FOR ALL ELEMENTS IN CIRCUIT. |

130

| FREQUENCY | AC CHARACTERISTIC |
|---|---|
| 1Hz~10MHz | SIMILARITY EQUAL TO AND LARGER THAN 90% |
| 10MHz~100MHz | SIMILARITY EQUAL TO AND LARGER THAN 95% |
| 100MHz~300MHz | SIMILARITY EQUAL TO AND LARGER THAN 99% |

132

ELECTRONIC-CIRCUIT ANALYSIS PROGRAM, METHOD, AND APPARATUS FOR WAVEFORM ANALYSIS

This application is a priority based on prior application No. JP2005-191544, filed Jun. 30, 2005, in Japan.

BACKGROUND OF THE INVENTION

1. Field of the Invention

The present invention relates to an electronic-circuit analysis program, method, and apparatus that checks the operation of an electronic circuit through simulation, and particularly to an electronic-circuit analysis program, method, and apparatus that checks the operation of an electronic circuit through simulation of waveform analysis.

2. Description of the Related Arts

With recent years' speedups of electronic circuits, for example, LSI (Large Scale Integration), printed circuit boards (Printed Circuit Board), and multichip modules, an increasing number of design changes in layer configuration and materials of LSIs, packages, and printed circuit boards have a non-negligible influence on signal waveform transmission. For this reason, signal waveform analysis at the time of design and design changes has become increasingly important. FIG. 1 is a block diagram showing one example of an electronic-circuit analysis apparatus. This electronic-circuit analysis apparatus includes a circuit-information input storage unit 300, an analysis-model generating unit 302, an analyzing unit 304, an analysis-result determining unit 306, and a display unit 308. The circuit-information input storage unit 300 has stored therein, as input information, analysis conditions, layout data, element-model data, and parameter data for use in a simulation of an electronic circuit. The analysis conditions include an analysis frequency, analysis time, and others. The layout data is data at the time of designing the board layout. The element-model data is data with electrical characteristics of elements written in a predetermined format. The parameter data represents analysis-purpose parameters corresponding to the material property and shape of the board. The analysis-model generating unit 302 generates an analysis model for simulation based on the input information stored in the circuit-information input storage unit 300, performs a simulation by using the model to be output to the analyzing unit 304, and outputs a waveform calculated with respect to an arbitrary measuring position of the electronic circuit to the analysis-result determining unit 306 and the display unit 308 as an analysis result. The waveform represents, for example, a voltage-value change with time. The analysis-result determining unit 306 uses a predetermined condition to perform a pass/fail determination on the analysis result, and outputs pass or fail as a determination result to the display unit 308. The predetermined condition is, for example, a threshold of a rated voltage of the element described in a data sheet or the like. Here, if a plurality of analysis results are present, the analysis-result determining unit 306 performs a plurality of pass/fail determinations. For example, in the case where the analysis result is a voltage waveform and the threshold for pass/fail determination is a maximum rated voltage value, it is assumed that when a peak value of the voltage value is equal to or lower than the maximum rated voltage value, the determination result indicates passed, and when the peak value exceeds the maximum rated voltage value, the determination result indicates failed. Also, when the threshold for pass/fail determination is VIH (the lower-limit voltage value with which the voltage is determined as High), it is assumed that when the voltage in the analysis result exceeds the threshold VIH during a time when High is expected, the determination result indicates passed, and when the voltage is equal to or lower than the threshold VIH, the determination result indicates failed. The display unit 308 displays the analysis result and passed or failed indicated by the determination result.

[Patent Document 1] Japanese Patent Laid-Open Publication No. 10-21267

Here, LSI manufacturing sources provide an element model for use in signal waveform analysis in a form of an IBIS model (Input/Output Buffer Information Specification Model), SPIC model (an industry-standard model for use in an SPICE-family simulator on the basis of an electronic-circuit simulator developed at University of California at Berkeley), encrypted SPICE model, or the like. These element models have been often revised due to a change in LSI design or a correction of a malfunction in generation conditions and measurement conditions of an element model. Moreover, in recent years, with speedups of LSIs, it has become difficult to design an LSI alone, and it might be the case where a revision of an LSI model requires a change in design of a printed circuit board. In the conventional electronic-circuit analysis apparatus, every time the design of an element model or a printed circuit board is changed, it is required to perform signal waveform analysis and waveform determination to check whether there is a problem in waveform quality and timing conditions of the circuit. However, with speedups and high-density of LSIs and printed circuit boards, the number of nets requiring signal waveform analysis is increasing. To perform all signal waveform analyses for every design change, a large amount of CPU time and manual check time is required. In this case, if an influence of revision of an element model on the waveform under the operation conditions of the circuit is small, it is not required to again perform signal waveform analysis However, to decide whether re-analysis is necessary, there are problems such that expert knowledge is required regarding signal waveform analysis for grasping changes of an element model or the like, and even if such a determination is possible, it takes a long time to perform manual determinations for all analysis targets.

SUMMARY OF THE INVENTION

According to present invention is to provide an electronic-circuit analysis program, method, and apparatus that allows an automatic decision as to whether signal waveform analysis is necessary at the time of a design change, an automatic analysis on only an electronic circuit requiring the analysis, and an automatic determination as to waveform quality and timing, thereby reducing time required for the analysis.

The present invention provides an electronic-circuit analysis program to be executed on a computer. The electronic-circuit analysis program according to the present invention causes the computer to execute steps including:

a circuit-information input step of inputting circuit information including an element model describing an electronic circuit;

a changed-circuit detecting step of detecting an electronic circuit using a changed element model in the circuit information;

an analysis-necessity deciding step of deciding whether waveform analysis is necessary by comparing a characteristic of an element model before change and a characteristic of the element model after change; and a determination-result processing step of displaying the result of deciding whether waveform analysis is necessary and making an instruction for waveform analysis of the electronic circuit using the element model after change for which it is determined that waveform analysis is necessary to cause the instruction to be executed.

In the electronic-circuit analysis program according to the present invention, the steps further includes a determination-necessity deciding step of making, when it is decided in the analysis-necessity deciding step that waveform analysis is not necessary and design requirement conditions of the electronic circuit including the element model after change are changed from design requirement conditions before change, an instruction for pass/failure determination as to whether the existing waveform analysis results satisfy the design requirement conditions after change to cause the instruction to be executed, and causing the determination result to be displayed.

Here, the electronic circuit is a transmission circuit formed of a driver element of an integrated circuit implemented on a board, a transmission path disposed on the circuit board and having connected thereto an output of the driver element, and a receiver element of another integrated circuit having an input connection with the transmission path.

The element model of the element circuit includes a driver element model, a transmission-path equivalent circuit model, a receiver element model, and a package equivalent circuit model of the integrated circuit.

In the analysis-necessity deciding step, a voltage/current characteristic, a transient characteristic, and a frequency characteristic are calculated as the characteristics of the element model before change and the element model after change, a similarity of each characteristic is calculated, when similarities of all characteristics are equal to or larger than predetermined thresholds, it is determined that waveform analysis is not necessary, and when a similarity of any one of the characteristics is smaller than the relevant threshold, it is determined that waveform analysis is necessary.

In the determining step, a voltage/current characteristic, a transient characteristic, and a frequency characteristic are calculated as the characteristics of the element model before change and the element model after change, an error of each characteristic is calculated, when errors of all characteristics are equal to or smaller than predetermined thresholds, it is determined that waveform analysis is not necessary, and when an error of any one of the characteristics is larger than the relevant threshold, it is determined that waveform analysis is necessary Further, in the present invention, in the circuit-information inputting step, the waveform analysis result of the electronic circuit using the element model before change is input, in the analysis-necessity deciding step, if it is determined that waveform analysis is not necessary, when the characteristic of the element model before change and the element model after change is out of an allowable range, necessity of re-determination of the analyzed waveform of the element model before change is output, and in the determination-result processing step, in accordance with the necessity of re-determination output from the determining step, analyzed waveform of the corresponding electronic circuit is displayed.

The present invention provides an electronic-circuit analysis method. The electronic-circuit analysis method of the present invention includes:

a circuit-information input step of inputting circuit information including an element model describing an electronic circuit;

a changed-circuit detecting step of detecting an electronic circuit using a changed element model in the circuit information;

an analysis-necessity deciding step of deciding whether waveform analysis is necessary by comparing a characteristic of an element model before change and a characteristic of the element model after change; and a determination-result processing step of displaying the result of deciding whether waveform analysis is necessary and making an instruction for waveform analysis of the electronic circuit using the element model after change for which it is determined that waveform analysis is necessary to cause the instruction to be executed.

Furthermore, the electronic-circuit analysis method of the present invention further includes a determination-necessity deciding step of making, when it is decided in the analysis-necessity deciding step that waveform analysis is not necessary and design requirement conditions of the electronic circuit including the element model after change are changed from design requirement conditions before change, an instruction for pass/failure determination as to whether the existing waveform analysis results satisfy the design requirement conditions after change to cause the instruction to be executed, and causing the determination result to be displayed The present invention provides an electronic-circuit analysis apparatus. The electronic-circuit analysis apparatus of the present invention includes:

a circuit-information input unit that inputs circuit information including an element model describing an electronic circuit;

a changed-circuit detecting unit that detects an electronic circuit using a changed element model in the circuit information;

an analysis-necessity deciding unit that decides whether waveform analysis is necessary by comparing a characteristic of an element model before change and a characteristic of the element model after change;

a determination-result processing unit that displays the result of deciding by the analysis-necessity deciding unit whether waveform analysis is necessary and makes an instruction for waveform analysis of the electronic circuit using the element model after change for which it is determined that waveform analysis is necessary to cause the instruction to be executed;

a determination-necessity deciding unit that makes, when it is decided by the analysis-necessity deciding unit that waveform analysis is not necessary and design requirement conditions of the electronic circuit including the element model after change are changed from those before change, an instruction for pass/failure determination as to whether the existing waveform analysis results satisfy the design requirement conditions after change to cause the instruction to be executed, and causes the determination result to be displayed.

Here, details of the electronic-circuit analysis method and apparatus according to the present invention are basically identical to those of the electronic-circuit analysis program of the present invention.

According to the present invention, when a design change occurs in a driver, receiver, printed circuit board, LSI package, etc., as an element model, an electronic circuit using the changed element model is detected. It is then decided before analysis whether waveform analysis as to whether the change of the element model affects the transmission waveform of the detected electronic circuit is necessary. A waveform analysis only on an electronic circuit requiring analysis is then automatically performed. With this, a manual study as to whether analysis is necessary is not required. For an electronic circuit with its transmission waveform not being affected, waveform analysis itself is not necessary, thereby reducing an analysis time. Also, even a person with no expert knowledge can know in advance the necessity of waveform analysis at the time of changing an element model. Furthermore, even if it is decided that the element model after change is identical to that before change and therefore waveform analysis is not necessary, when design requirement conditions of the electronic circuit using the element model after change, for example, operation conditions, such as a voltage margin, timing, and threshold, become restrict, the pass/fail determination as to the existing analysis results is automatically performed by using the design requirement conditions after change, thereby dispensing with a study as to whether the waveform-analysis result associated with the change of the element model is necessary. The above and other objects, features, and advantages of the present invention will become more apparent from the following detailed description with reference to the drawings.

BRIEF DESCRIPTION OF THE DRAWINGS

FIG. 9 is a drawing for describing a data format of a driver provided in an IBIS model for use in the present invention;

FIG. 10 is a drawing continued from FIG. 9 for describing the data format of the driver;

FIG. 11 is a drawing for describing a data format of a receiver provided in the IBIS model for use in the present invention;

FIG. 17 is a drawing for describing analysis-necessity determination thresholds for a voltage/current characteristic for use in the present invention;

FIG. 18 is a drawing for describing analysis-necessity determination thresholds for a transient characteristic for use in the present invention;

DETAILED DESCRIPTION OF THE PREFERRED EMBODIMENTS

Figure 1:
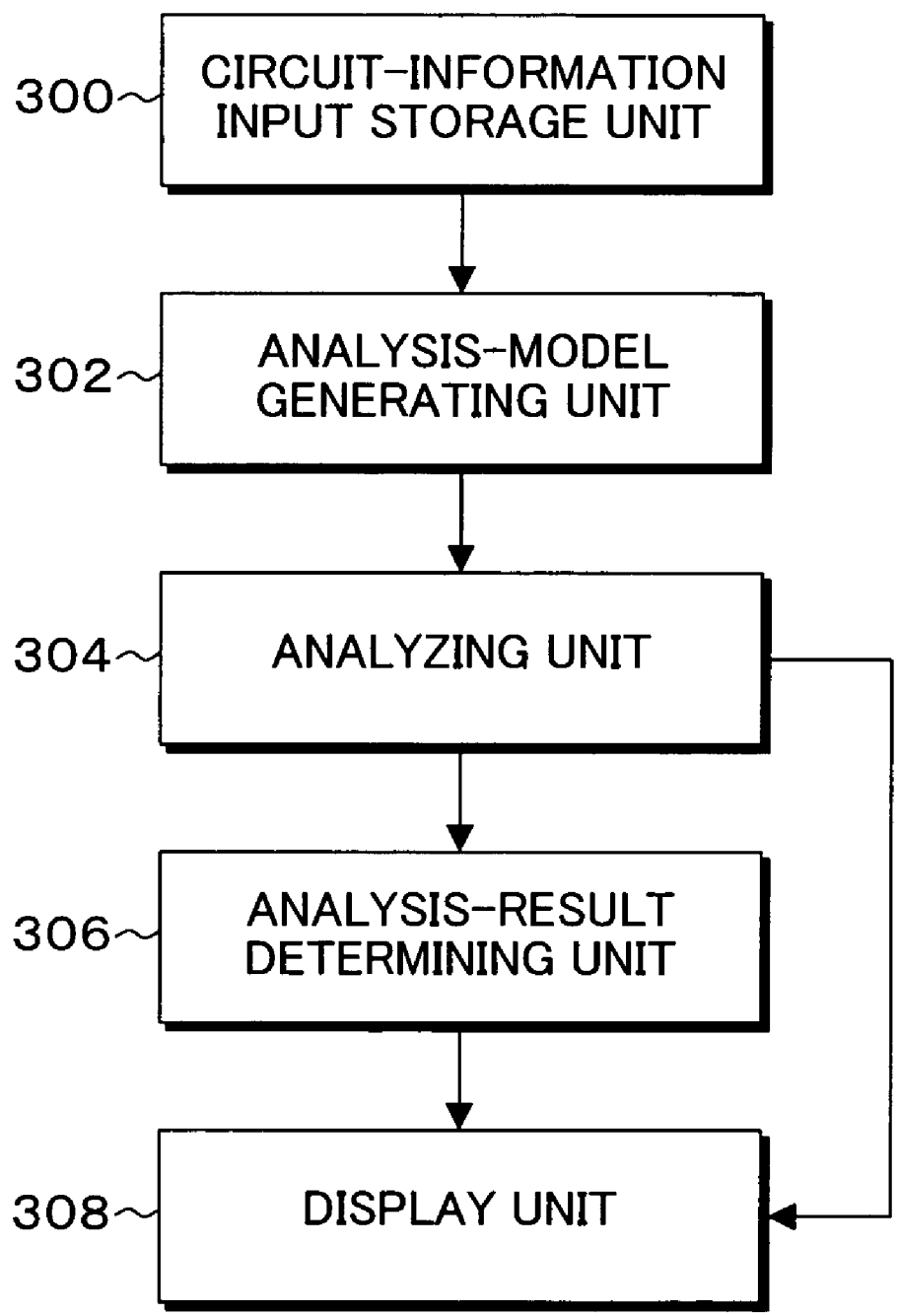
FIG. 1 is a drawing for describing a conventional electronic-circuit analysis apparatus.
Figure 2A:
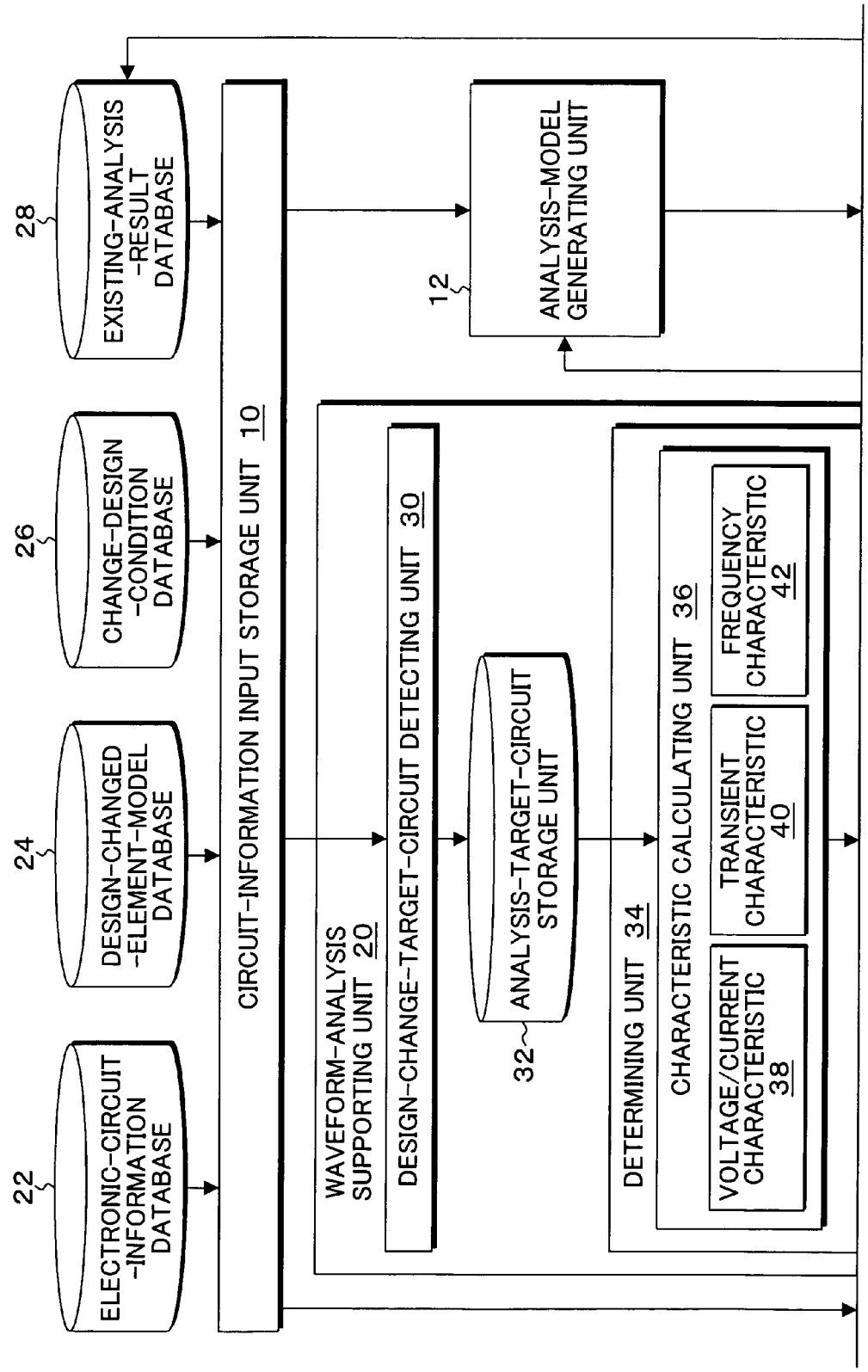
FIGS. 2A and 2B are block diagrams of a functional structure of an electronic-circuit analysis apparatus according to the present invention.
Figure 2B:
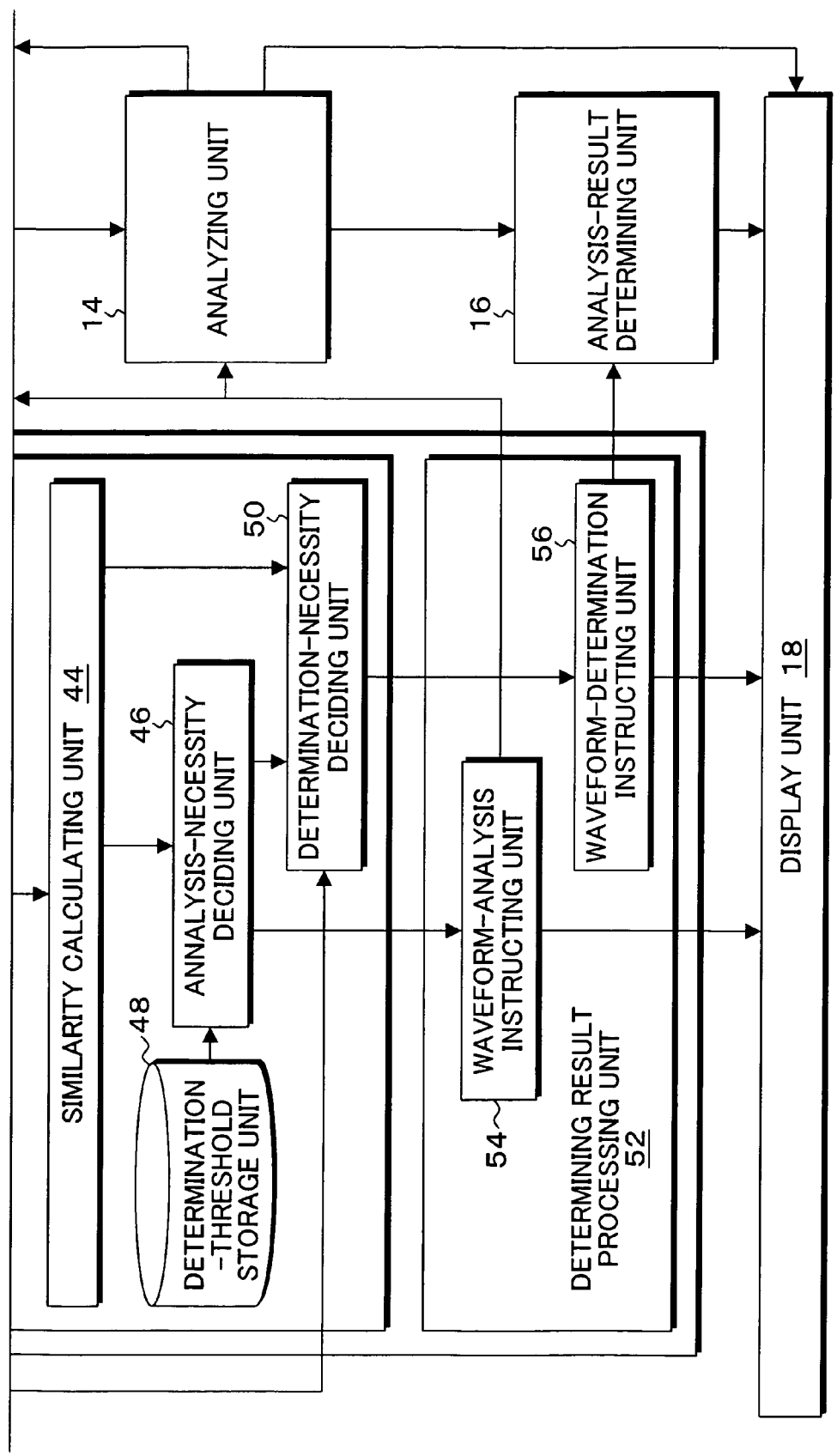

FIGS. 2A and 2B are block diagrams of a functional structure of an electronic-circuit analysis apparatus according to the present invention. In FIGS. 2A and 2B, the electronic-circuit analysis apparatus of the present invention includes a circuit-information input storage unit 10, an analysis-model generating unit 12, an analyzing unit 14, an analysis-result determining unit 16, a display unit 18, and further a waveform-analysis supporting unit 20. Of these, components other than the waveform-analysis supporting unit 20 are identical to those in the conventional waveform analysis apparatus. The circuit-information input storage unit 10 includes an electronic-circuit-information database 22, a design-changed-element-model database 24, a change-design-condition database 26, and the existing-analysis-result database 28. In the electronic-circuit-information database 22, as information necessary for a simulation of the electronic circuit with a circuit design on the board being completed, (1) analysis conditions;
(2) layout data;
(3) element model data; and
(4) parameter data.

are stored.

The analysis conditions include an analysis frequency, analysis time, and others, and the layout data is data at the time of designing the board layout. Also the element model data is data in which electrical characteristics of an element, such as a driver or receiver, used in the electronic circuit are formatted and written according to an IBIS model, for example. Furthermore, the parameter data represents analysis-purpose parameters corresponding to the material property and shape of the printed board. The design-changed-element-model database 24 has stored therein element model data regarding a changed element model used in an electronic circuit stored in the electronic-circuit-information database 22, the element model being changed through revision or the like. The design-changed-element-model database 24 is generated from an difference between the electronic-circuit-information database 22 and a electronic-circuit-information database after design change. The change-design-condition database 26 has stored therein design conditions of the electronic circuit changed in association with revision of the LSI or the circuit board, specifically, data regarding operation conditions, such as a voltage margin, timing, and threshold, of the design circuit. Furthermore, the existing-analysis-result database 28 has stored therein analysis results of waveform analysis already performed on the electronic circuit stored in the electronic-circuit-information database 22. When an analysis of the electronic circuit is requested, the circuit-information input storage unit 10 reads each information in the database for storage. The waveform-analysis supporting unit 20 includes a design-change-target-circuit detecting unit 30, an analysis-target-circuit storage unit 32, a determining unit 34, and a determination-result processing unit 52. The design-change-target-circuit detecting unit 30 detects, based on the design-changed-element-model database 24, an electronic circuit using the changed element model stored in the circuit-information input storage unit 10 for storage in the analysis-target-circuit storage unit 32. The determining unit 34 determines whether waveform analysis is necessary by comparing a characteristic of the element model before change and a characteristic of the element model after change. The determination-result processing unit 52 instructs the analysis-model generating unit 12, the analyzing unit 14, and the analysis-result determining unit 16 to perform waveform analysis for the electronic circuit determined as requiring waveform analysis, and for the electronic circuit determined as not requiring waveform analysis, causes such an indication to be displayed on the display unit 18. The determining unit 34 includes a characteristic calculating unit 36, a similarity calculating unit 44, an analysis-necessity deciding unit 46, a determination-threshold storage unit 48, and a determination-necessity deciding unit 50. Also, the determination-result processing unit 52 includes a waveform-analysis instructing unit 54 and a waveform-determination instructing unit 56. In the present embodiment, the characteristic calculating unit 36 includes three units, that is, a voltage/current-characteristic calculating unit 38, a transient-characteristic calculating unit 40, and a frequency-characteristic calculating unit 42, to calculate each characteristic for the element model after change used in the analysis-target circuit. The similarity calculating unit 44 calculates similarities between the voltage/current characteristic, the transient characteristic, and the frequency characteristic calculated by the characteristic calculating unit 36 and those of the element model before change. The characteristics of the element model before change stored in the existing-analysis-result database 28 are used. The analysis-necessity deciding unit 46 compares each of the similarities of the voltage/current characteristic, the transient characteristic, and the frequency characteristic calculated by the similarity calculating unit 44 with each relevant determination threshold stored in the determination-threshold storage unit 48, and when the similarities of all of the voltage/current characteristic, the transient characteristic, and the frequency characteristic are equal to or larger than the determination thresholds, decides that waveform analysis is not necessary for the determination-target electronic circuit using the changed element model. On the other hand, when at least one of the similarities of the voltage/current characteristic, the transient characteristic, and the frequency characteristic is smaller than the determination threshold, it is decided that waveform analysis is necessary, and with an output to the waveform-analysis instructing unit 54 provided to the determination-result processing unit 52, an instruction for performing a waveform analysis process by the analysis-model generating unit 12, the analyzing unit 14, and the analysis-result determining unit 16 is issued, and the analysis result is caused to be displayed on the display unit 18. For the electronic circuit using the changed element model determined by the analysis-necessity deciding unit 46 as not requiring waveform analysis, when design requirement conditions after change obtained from the change-design-condition database 26, that is, for example, operation conditions, such as a voltage margin, timing, and threshold, for the electronic circuit using the changed element model are stricter than design requirement conditions in the element model before change, for the electronic circuit using the existing element model regarded as identical to the changed element model, the determination-necessity deciding unit 50 causes a process of determining whether the waveform analysis result passes or fails by applying change design conditions to the existing waveform analysis results stored in the existing-analysis-result database 28 to be performed upon an instruction from the waveform-determination instructing unit 56 to the analysis-result determining 16, and causes the result to be displayed on the display unit 18.

Figure 3:
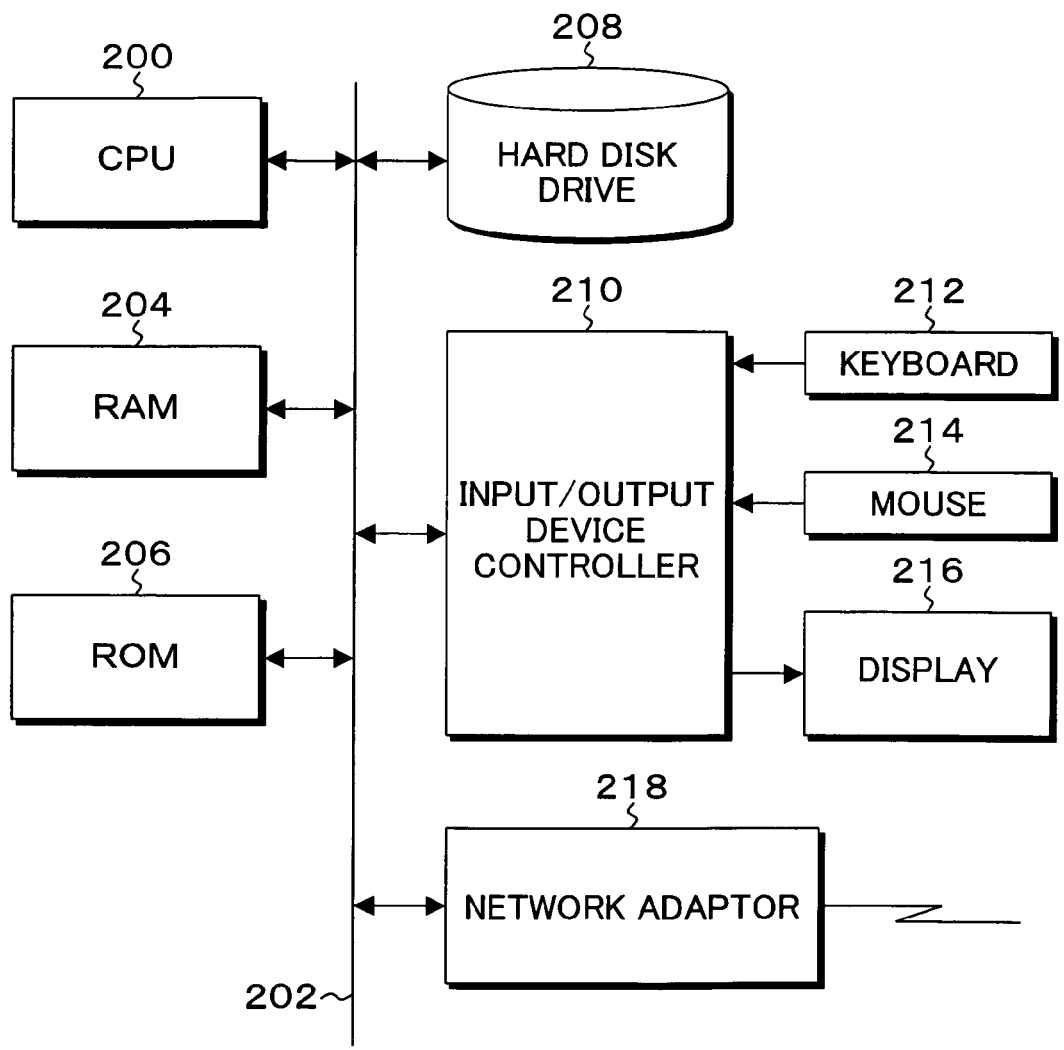
FIG. 3 is a block diagram of a hardware environment of a computer in which the electronic-circuit analysis apparatus according to the present invention is achieved.

FIG. 3 is a block diagram of a hardware environment of a computer in which the electronic-circuit analysis apparatus according to the present invention is achieved. In FIG. 3, a bus 202 of an MPU 200 is provided with a RAM 204, a ROM 206, a hard disk drive 208, an input/output device controller 210 provided with a keyboard 212, a mouse 214, and a display 216, and a network adaptor 218. The hard disk drive 208 has loaded therein a program for executing an electronic-circuit analysis process of the present invention, which is read at the time of activating the computer to be developed on the RAM 204 and be executed by the MPU 200.

Figure 4:
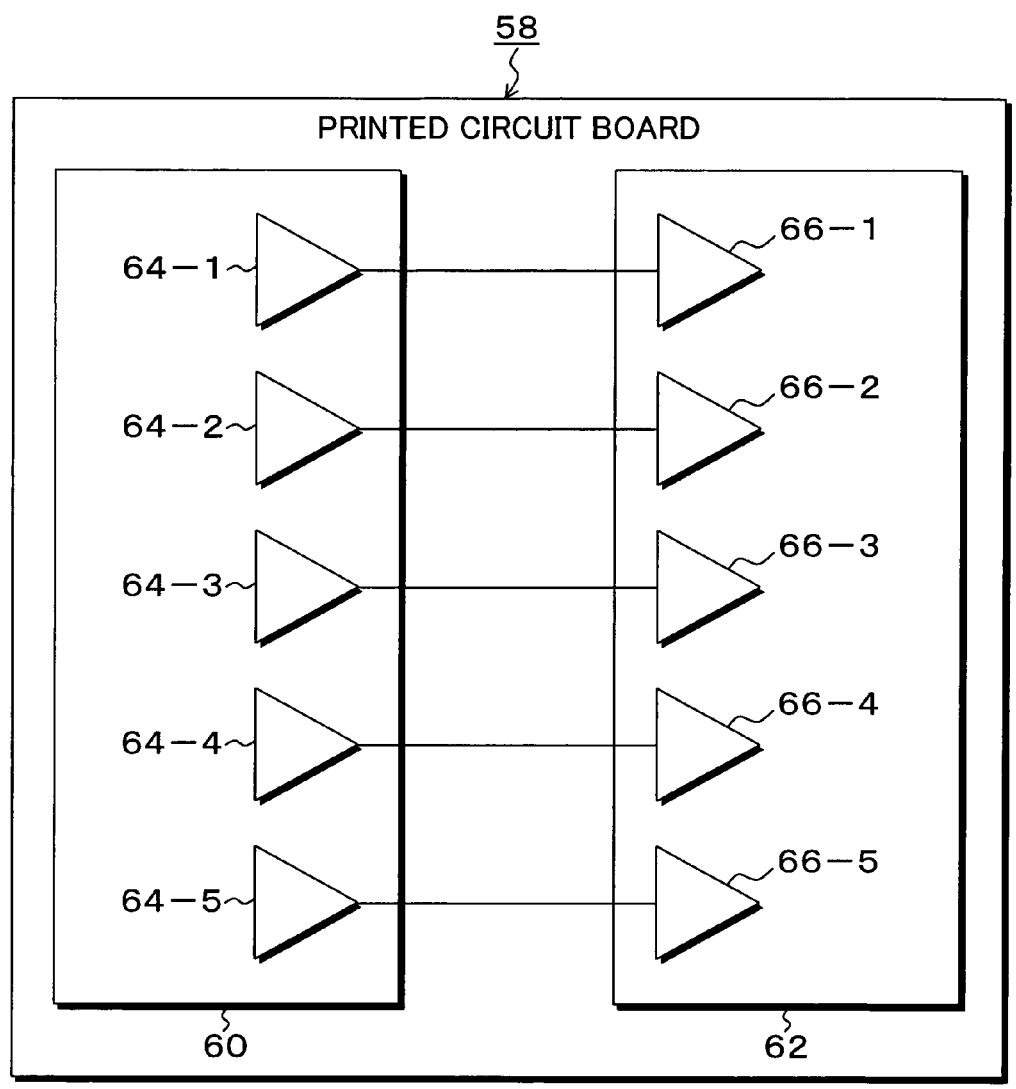
FIG. 4 is a drawing for describing an electronic circuit taken as an analysis target in the present invention.

FIG. 4 is a drawing for describing an electronic circuit taken as an analysis target in the embodiment of FIGS. 2A and 2B. In FIG. 4, the electronic circuit taken as an analysis target has a printed circuit board 58 on which LSIs 60 and 62 are implemented. Outputs from drivers 64-1 to 64-5 provided on the LSI 60 are input via a transmission pattern on the printed circuit board 58 to receivers 66-1 to 66-5 disposed on the LSI 62. Information necessary for simulation of the above-structured electronic circuit of FIG. 4 is stored in the electronic-circuit-information database 22 of FIGS. 2A and 2B. First, at the stage where the electronic circuit has been manufactured, like the conventional technology, waveform analysis is performed through simulation of the electronic circuit by the analysis-model generating unit 12 and the analyzing unit 14 and, for the waveform obtained as an analysis result, a pass/fail determination is made by the analysis-result determining unit 16. The waveform analysis result and the pass/fail determination result are stored in the existing-analysis-result database 28. For the electronic circuit as shown in FIG. 4, when a design change is later made on a driver, receiver, circuit board, or further a package of an LSI that are used in the electronic circuit, waveform analysis using the waveform analysis apparatus according to the present invention is again necessary after the design change.

Figure 5:
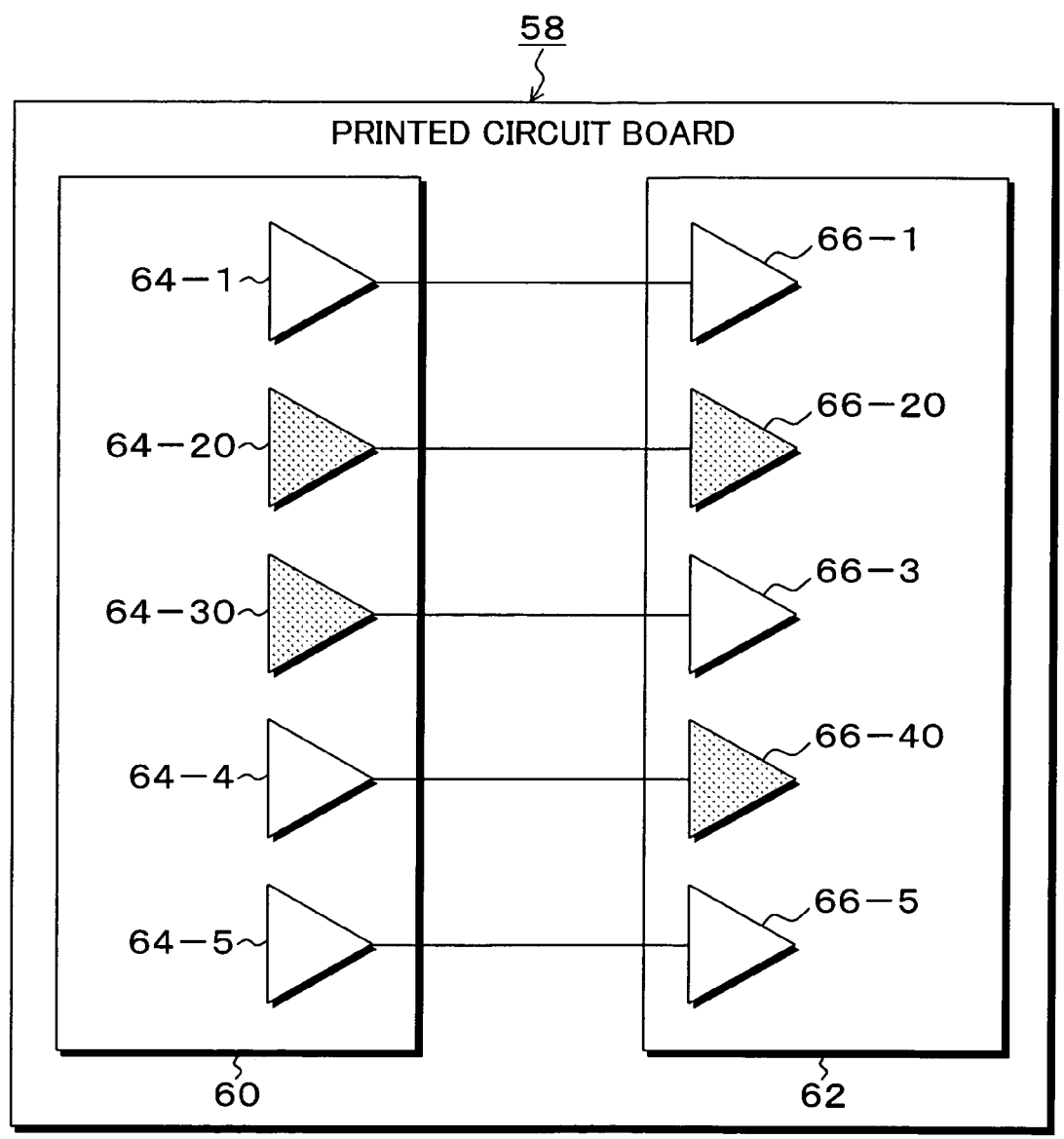
FIG. 5 is a drawing for describing the case in which element models in the electronic circuit in FIG. 4 have been changed.

FIG. 5 is a drawing for describing the electronic circuit when element models of a driver and a receiver in the electronic circuit in FIG. 4 have been changed. FIG. 5 shows an exemplary case where, for the LSIs 60 and 62 implemented on the printed circuit board 58, the element models of the drivers 64-20 and 64-30 of the LSI 60 and the receivers 66-20 and 66-40 of the LSI 62 have been changed.

Figure 6:
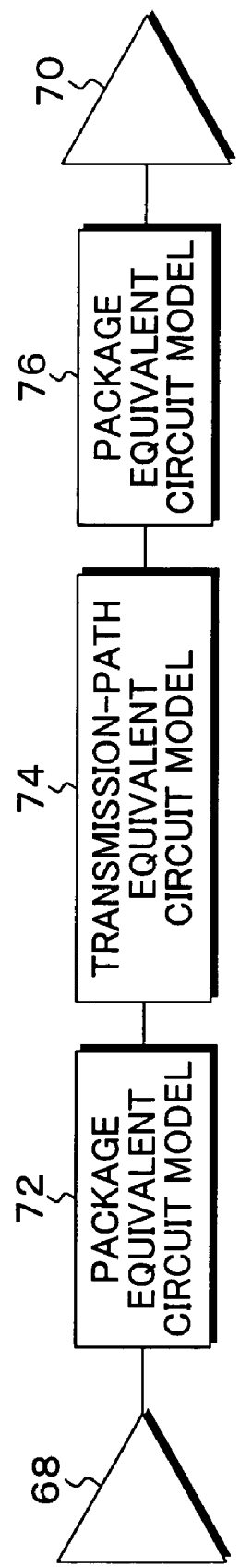
FIG. 6 is a drawing of equivalent circuits in an electronic circuit model taken as an analysis target in the present invention.

FIG. 6 is a drawing of equivalent circuits in an electronic circuit model taken as an analysis target in the present invention. The electronic-circuit equivalent model of FIG. 6 includes a driver element model 68 and a receiver element model 70, and includes therebetween an LSI package equivalent circuit model 72 having implemented thereon the driver element model 68, a transmission-path equivalent circuit model 74 with a transmission path pattern of the printed circuit board being taken as a target, and further an LSI package equivalent circuit model 76 having implemented thereon the receiver element model 70.

Figure 7:
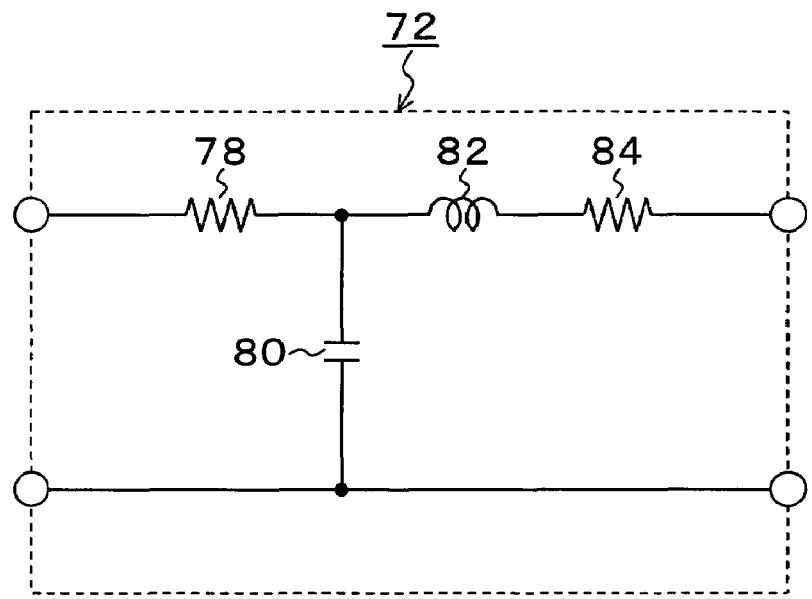
FIG. 7 is a circuit diagram of a package equivalent circuit model of FIG. 6.

FIG. 7 is a circuit diagram of the package equivalent circuit model 72 of FIG. 6, which includes resistance components 78 and 84, a capacitor component 80, and an inductance component 82. Each of these components will have a different value according to a change in package of the LSI.

Figure 8:
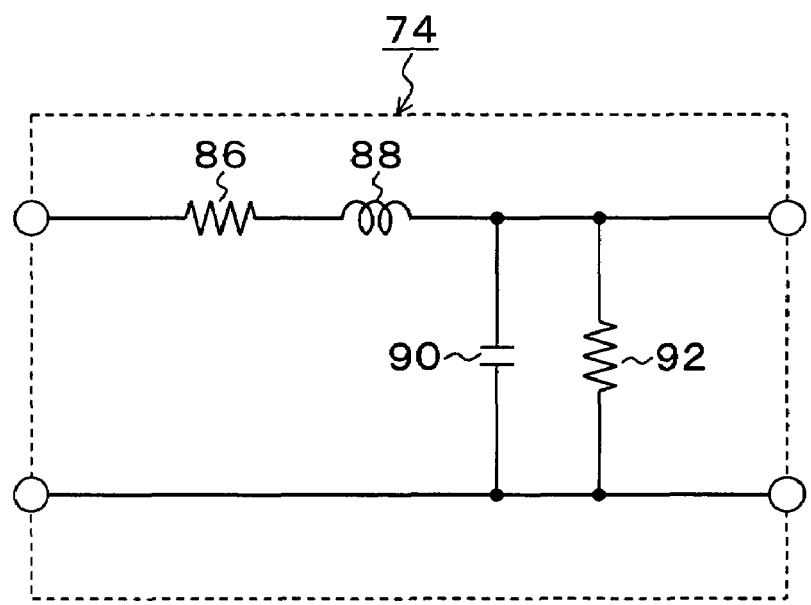
FIG. 8 is a circuit diagram of a transmission-path equivalent circuit model of FIG. 6.

FIG. 8 is a circuit diagram of the transmission-path equivalent circuit model 74 of FIG. 6. The transmission-path equivalent circuit model 74 includes resistance components 86 and 92, an inductance component 88, and a capacitor component 90. In the transmission-path equivalent circuit model 74, each component has a unique value corresponding to the material property and shape of the printed circuit board of the electronic circuit. When a design change occurs in the printed circuit board to cause a change in material property and shape, the value of each component becomes a changed value.

FIG. 9 is a drawing for describing, as a specific example of the element model for use in electronic circuit analysis of the present invention, a data format of a driver provided in an IBIS model, with parameters regarding determination being added thereto, and FIG. 10 is a continuation thereof.

In FIGS. 9 and 10, a driver voltage/current characteristic model 94 includes:

(A) parameters regarding characteristic; and
(B) parameters regarding determination.

Of these, the parameters regarding characteristic include:
(1) power supply voltage;
(2) input/output capacity;
(3) voltage/current characteristic of pull-up;
(4) voltage/current characteristic of pull-down;
(5) voltage/current characteristic of ground clamp;
(6) voltage/current characteristic of power clamp;
(7) element rising time;
(8) element trailing time;
(9) load resistance; and
(10) timing measurement voltage.

On the other hand, as the parameters regarding determination,
(1) minimum value of a time from clock input to data output; and
(2) maximum value of a time from clock input to data output are set. The data of the driver voltage/current characteristic model provided as the IBIS model can be dealt as an element model representing an element exemplified by a driver used in an LSI or a circuit board only by the voltage/current characteristic.

FIG. 11 is a drawing for describing a data format of a receiver taken as a target for electronic circuit analysis according to the present invention and provided as an IBIS model, with parameters regarding determination, a setup time, and a hold time being added thereto. A receiver voltage/current characteristic model 96 of FIG. 11 includes two types of parameters:

(A) parameters regarding characteristic; and
(B) parameters regarding determination.

The parameters regarding characteristic include:
(1) power supply voltage;
(2) input/output capacity;
(3) voltage/current characteristic of ground clamp; and
(4) voltage/current characteristic of power clamp.

On the other hand, the parameters regarding determination include:
(1) threshold voltage at low side;
(2) threshold voltage;
(3) threshold voltage at high side;
(4) overshoot voltage;
(5) undershoot voltage;
(6) setup time; and
(7) hold time.

Figure 12A:
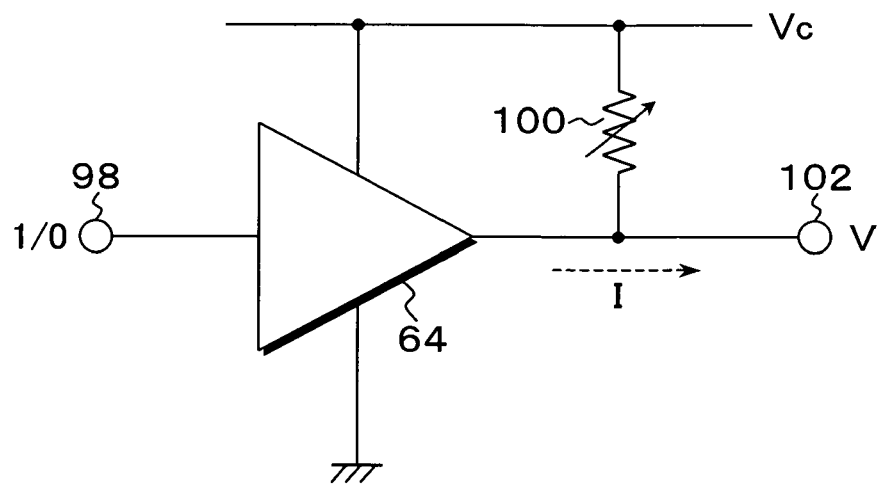
FIGS. 12A and 12B are drawings for describing analysis of voltage/current characteristic of the driver in the present invention.
Figure 12B:
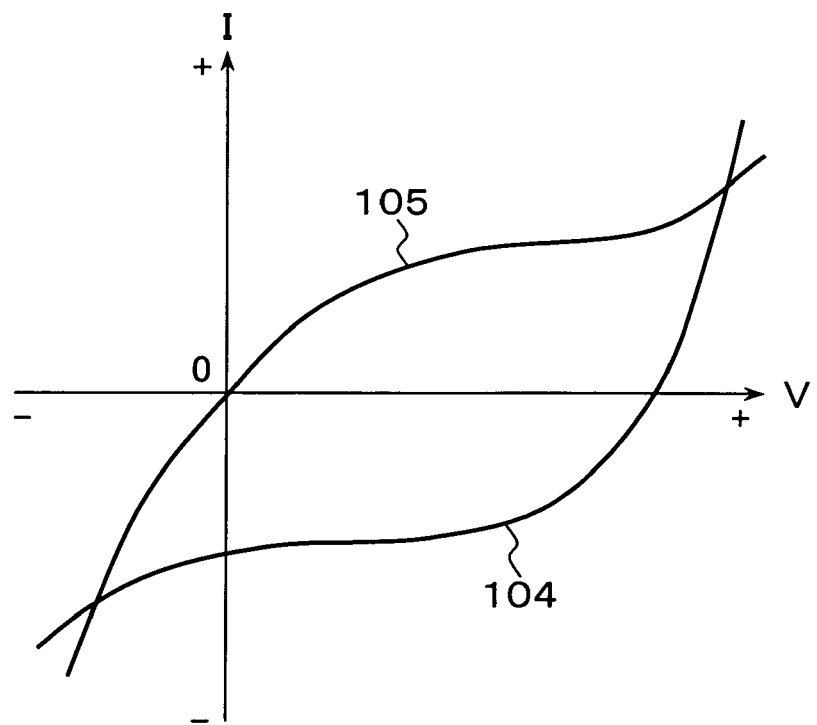

With respect to the driver voltage/current characteristic model 94 of FIGS. 9 and 10 and the receiver voltage/current characteristic model 96 of FIG. 11, when these element models are changed, the voltage/current characteristic calculating unit 38 provided in the characteristic calculating unit 36 of FIGS. 2A and 2B calculates a voltage/current characteristic for the driver as shown in FIGS. 12A and 12B, for example.

FIG. 12A shows a circuit for calculating a voltage/current characteristic for a driver 64. With a bit of "1" or a bit "0" being fixed to an input terminal 98, a variable voltage source 100 is adjusted, and an output voltage V and an output current I with respect to an output terminal 102 are calculated. FIG. 12B shows calculation results of the voltage/current characteristic of the driver 64. A characteristic 104 represents a voltage/current characteristic when the input terminal 98 is fixed to the bit of "1". Also, a characteristic 105 represents a voltage/current characteristic when the input terminal 98 is fixed to the bit of "0".

Figure 13A:
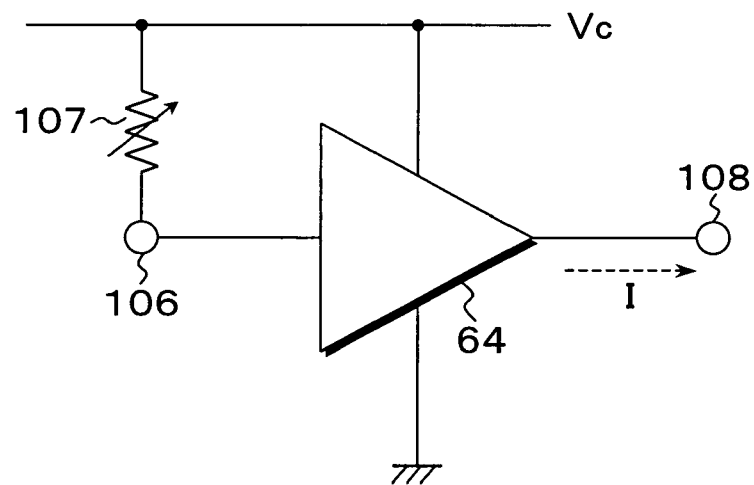
FIGS. 13A and 13B are drawings for describing analysis of a voltage/current characteristic of the receiver in the present invention.
Figure 13B:
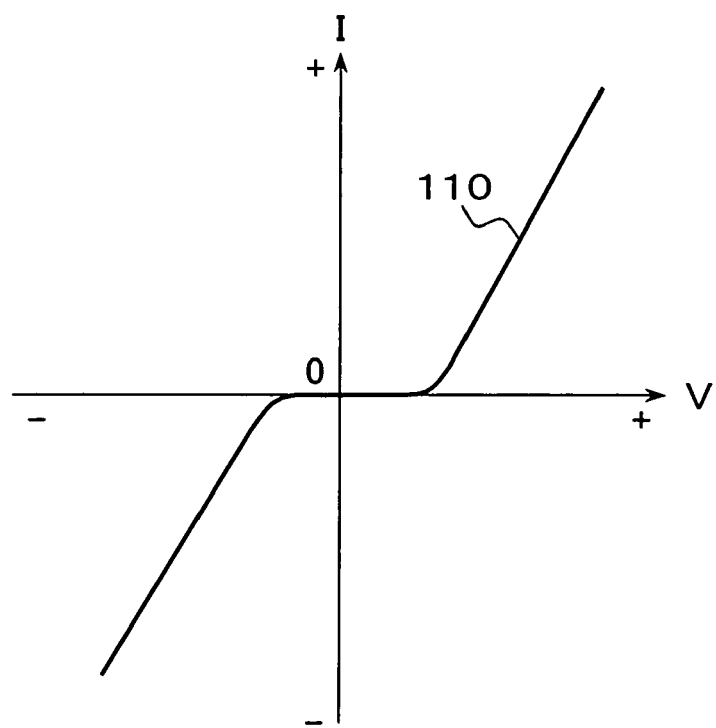

FIGS. 13A and 13B are drawings for describing a process of calculating a voltage/current characteristic of the receiver voltage/current characteristic model 96 of FIG. 11. FIG. 13A shows a circuit for calculating a voltage/current characteristic for a receiver 66 and, by varying an output voltage V of an output terminal 108 while adjusting a variable voltage source 107, an output current I at that time is found. FIG. 13B shows calculation results of the voltage/current characteristic of the receiver 66. As the current I with respect to changes of the voltage V, a characteristic 110 is obtained. Here, the voltage/current characteristic of the driver 64 and the voltage/current characteristic of the receiver 66 shown in FIGS. 12 and 13, respectively, are known as analysis characteristics by DC sweep. Further, based on the calculation results of the voltage/current characteristics of the driver 64 and the receiver 66, in the determining unit 34 of FIGS. 2A and 2B, the similarity calculating unit 44 calculates a similarity in voltage/current characteristic between each driver and receiver before change and each driver and receiver after change. The similarity of the voltage/current characteristic is given by the following equation when an error between the voltage/current characteristic of the element model before change and the voltage/current characteristic of the element model after change is found as a percentage.

$$(\text{similarity}) = (100\%) - (\text{percent error}) \quad \text{(Equation 1)}$$

With such a calculation of the similarity, a numerical value representing a similarity which is smaller as the error is larger can be found.

Figure 14A:
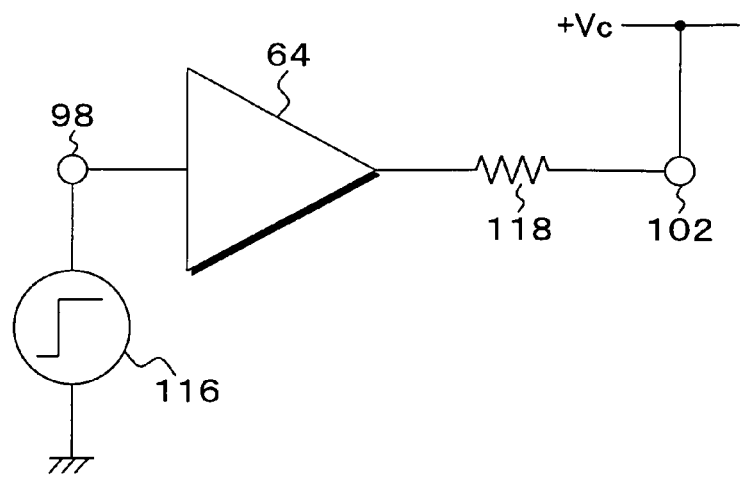
FIGS. 14A to 14C are drawings for describing analysis of a transient characteristic in the present invention.
Figure 14B:
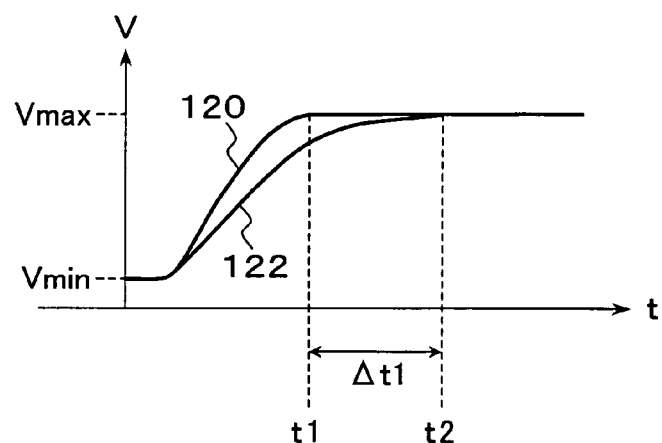
Figure 14C:
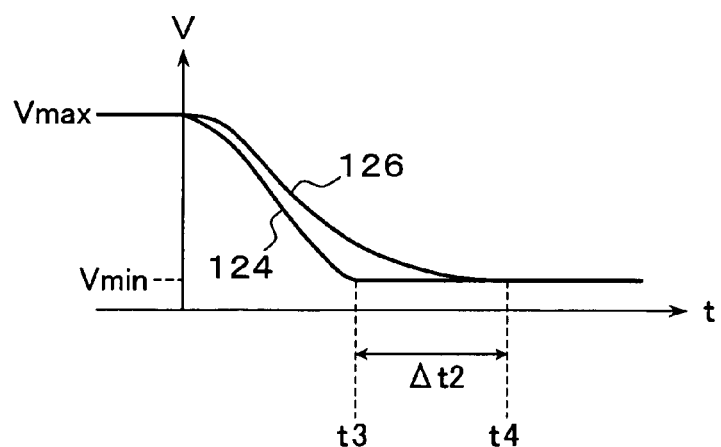

FIGS. 14A to 14C are drawings for describing a calculation process by a transient-characteristic calculating unit 40 provided to the characteristic calculating unit 36 of FIGS. 2A and 2B by taking the driver 64 used in the circuit as an analysis target of the present invention. FIG. 14A shows a circuit for calculating a cut characteristic of the driver 64, wherein a pulse generating source 116 is connected to the input terminal 98 of the driver 64 and an output is connected to the output terminal 102 via a resistor 118, and the output terminal 102 has a pull-up connection with a power supply voltage +Vc. FIG. 14B shows rising waveforms of the driver with respect to a pulse input. These rising waveforms represent a characteristic 120 for the driver before change and a characteristic 122 for the driver after change. Upon calculation of these transient characteristics, the similarity calculating unit 44 of FIGS. 2A and 2B calculates a similarity between the rising characteristic 120 before change and the rising characteristic 122 after change.

Calculation of the similarity in transient characteristic is performed in the following procedure.

(1) Find a maximum value Vmax and a minimum value Vmin within an amplitude rage of all waveform data.

(2) From a minimum value of an absolute value error between a voltage value V1 at each time t and a voltage value V2 (t2) of a comparison waveform within a range plus or minus Δt time, calculate a similarity at each time.

$$\text{Similarity}=(100\%)-\text{Min}(|V1-V2(t2)|)/(V\text{max}-V\text{min})\times 100\% \ (t-\Delta t)=t2=(t+\Delta t) \quad \text{(Equation 2)}$$

FIG. 14C shows trailing characteristics in calculation of the transient characteristic of the driver 64, wherein a characteristic 124 represents a trailing characteristic before change and a characteristic 126 represents a trailing characteristic after change. Also for these trailing characteristics of the driver 64, as is the case of the rising characteristics of FIG. 14B, (1) Find a maximum value Vmax and a minimum value Vmin within an amplitude rage of all waveform data.

(2) From a minimum value of an absolute value error between a voltage value V1 at each time t and a voltage value V2 (t2) of a comparison waveform within a range plus or minus Δt time, calculate a similarity at each time.

$$\text{Similarity}=(100\%)-\text{Min}(|V1-V2(t2)|)/(V\text{max}-V\text{min})\times 100\% \ (t-\Delta t)=t2=(t+\Delta t) \quad \text{(Equation 3)}$$

Figure 15:
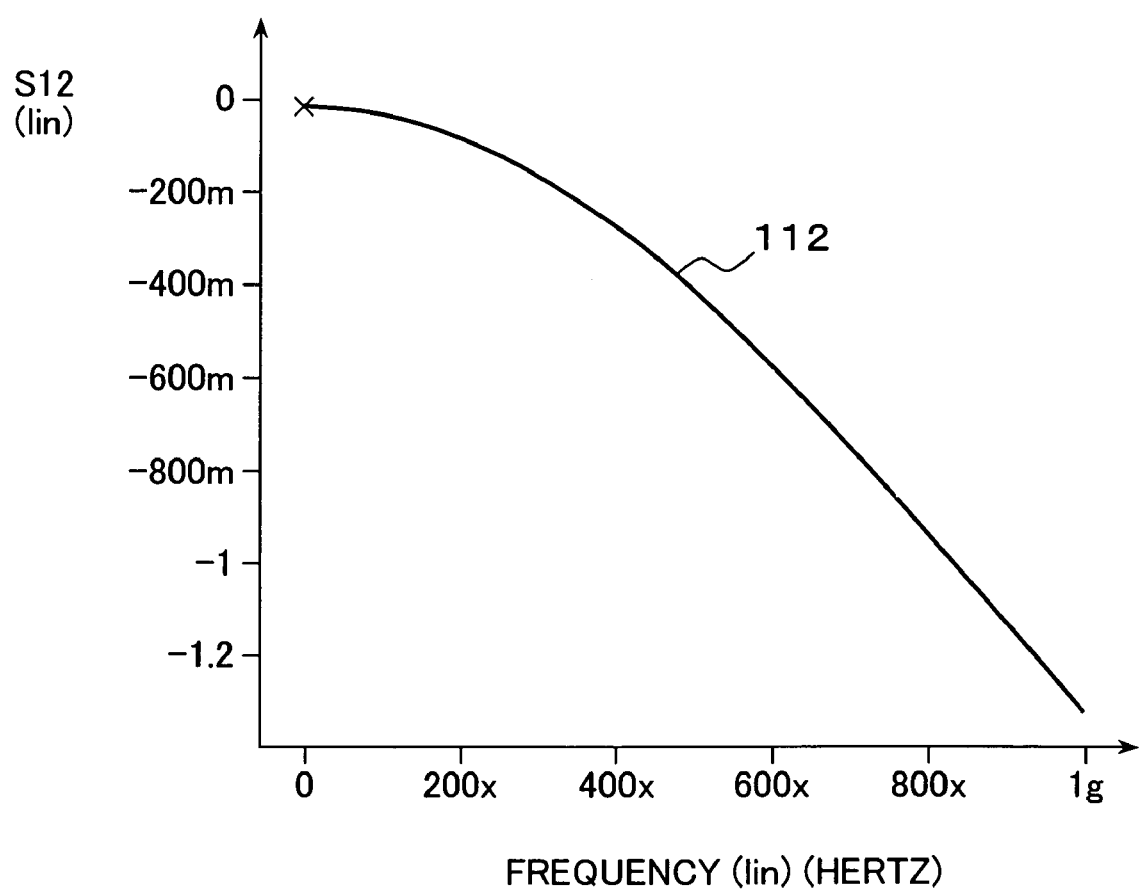
FIG. 15 is a drawing for describing an S12 transmission characteristic obtained through frequency analysis in the present invention.

FIG. 15 shows a frequency characteristic of the driver calculated by the frequency-characteristic calculating unit 42 provided to the characteristic calculating unit 36 of FIGS. 2A and 2B, wherein this frequency characteristic is normally found through AC sweep analysis. FIG. 15 shows the calculation result of S12 transmission characteristic 112 given, as the frequency characteristic of the driver, by S11 parameter in S parameters. This S12 transmission characteristic 112 represents a power gain in a direction reverse to that of a power gain when the impedance of the power source and that of the load are equal to each other at Z0 with the driver being taken as a four-terminal network.

Figure 16:
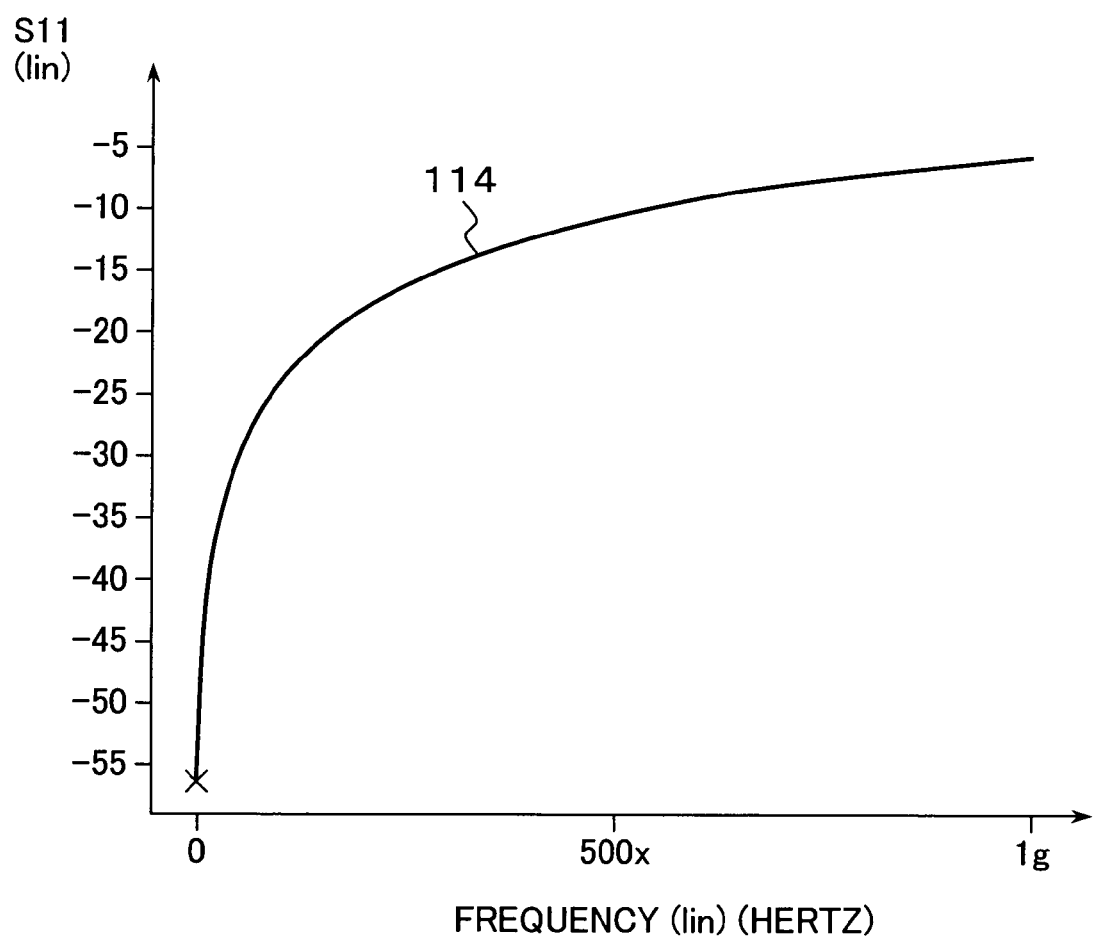
FIG. 16 is a drawing for describing an S11 reflection characteristic obtained through frequency analysis in the present invention.

FIG. 16 shows an S11 reflection characteristic 114 calculated through AC sweep of an S parameter for the driver. This S11 reflection characteristic 114 is calculated as a value obtained by dividing a power reflected from an input stage of the driver by a power incident to an input stage of the driver. Other than that, S21 transmission characteristic, S22 reflection characteristic, and others may be calculated.

FIG. 17 is a drawing for describing thresholds for use by the analysis-necessity deciding unit 46 of FIGS. 2A and 2B in determining whether waveform analysis is necessary for the similarity of the voltage/current-characteristic. In FIG. 17, a voltage/current-characteristic threshold table 128 has set therein V-I characteristics (voltage/current characteristics) serving as determination thresholds divided into frequency ranges. As the frequency ranges, there are three bands:

(1) 1 Hz to 10 MHz;

(2) 10 MHz to 100 MHz; and (3) 100 MHz to 300 MHz.

In these frequency ranges, determination criteria, represented as the V-I characteristics, as to whether waveform analysis is necessary are as follows. (1) In frequency bands of 1 Hz to 10 MHz, the similarity is equal to or larger than 90% and in a range of 0 volt to the power supply voltage and in a range where the absolute value of the current is equal to or smaller than 100 mA, and the similarity is equal to or larger than 80% under conditions otherwise. (2) In frequency bands of 10 MHz to 100 MHz, the similarity is equal to or larger than 95% and in a range of 0 volt to the power supply voltage and in a range where the absolute value of the current is equal to or smaller than 100 mA, and the similarity is equal to or larger than 90% under conditions otherwise; (3) In frequency bands of 100 MHz to 300 MHz, the similarity is equal to or larger than 99% and in a range of 0 volt to the power supply voltage and in a range where the absolute value of the current is equal to or smaller than 100 mA, and the similarity is equal to or larger than 95% under conditions otherwise; As evident from the contents of the voltage/current-characteristic threshold table 128, as the frequency is higher, the similarity for dispensing with waveform analysis is higher.

FIG. 18 is a drawing for describing a transient-characteristic threshold table 130 for a transient characteristic known as the AC characteristic. In FIG. 18, the transient-characteristic threshold table 130 has set therein thresholds serving as transient-characteristic voltage axes separated into three frequency ranges, that is, 1 Hz to 10 MHz, 10 MHz to 100 Hz, and 100 MHz to 300 MHz. The threshold characteristics given as transient-characteristic voltage axes are as follows by taking the frequencies 1 Hz to 10 MHz as an example.

(1) The error is within 50 mV in all elements in the circuit.

(2) A value of the sum of maximum values of the voltage error is within 100 mV for all elements in the circuit.

(3) An allowable time is within 100 ps in all elements in the circuit.

(4) A value of the sum of maximum values of the allowable time is within 1000 ps for all elements in the circuit. As the frequency is higher, the value of the transient-characteristic voltage axis is stricter and a higher similarity is taken as a threshold.

Figures 19, 20:
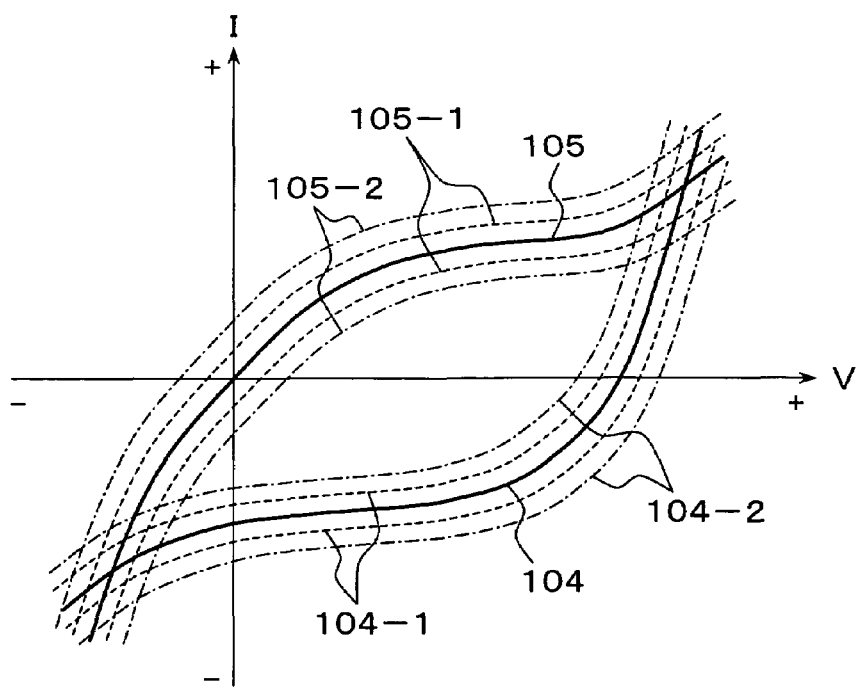
FIG. 19 is a drawing for describing analysis-necessity determination thresholds for a frequency characteristic for use in the present invention.
FIG. 20 is a drawing for describing analysis necessity determination for the voltage/current characteristic of the driver in the present invention.

FIG. 19 is a drawing for describing a frequency-characteristic threshold table 132 having set therein thresholds for determining whether waveform analysis is necessary for the similarity of the frequency characteristic in the present invention. In the frequency-characteristic threshold table 132, the following cases are those set as determination threshold for determining that waveform analysis is not necessary.

(1) In a frequency range of 1 Hz to 10 MHz, the similarity is equal to or larger than 90%;

(2) In a frequency range of 10 MHz to 100 MHz, the similarity is equal to or larger than 95%;

(3) In a frequency range of 100 MHz to 300 MHz, the similarity is equal to or larger than 99%

FIG. 20 is a drawing for describing analysis necessity determination for the voltage/current characteristic of the driver in the present invention. In FIG. 20, when the characteristics of the driver before change are those represented by characteristics 104 and 105, for example, a threshold characteristic 104-1 with a similarity of 90% and a threshold characteristic 104-2 with a similarity of 80% are set as ranges in which waveform analysis is not necessary for the driver after change. Then, as shown in the voltage/current-characteristic threshold table 128 of FIG. 17, in a frequency range where the voltage V is in a range of 0 to the power supply voltage and the absolute value of the current is in a range equal to or smaller than 100 mA, if the voltage/current characteristic of the driver after change is within a range of the 90%-similarity characteristic 104-1, the driver after change is regarded as being identical to the driver before change, and it is determined that waveform analysis is not necessary. In this case, in the ranges other than that requiring the similarity of 90%, it is enough for the characteristic to be within a range of the 80%-similarity threshold characteristic 104-2.

Figure 21:
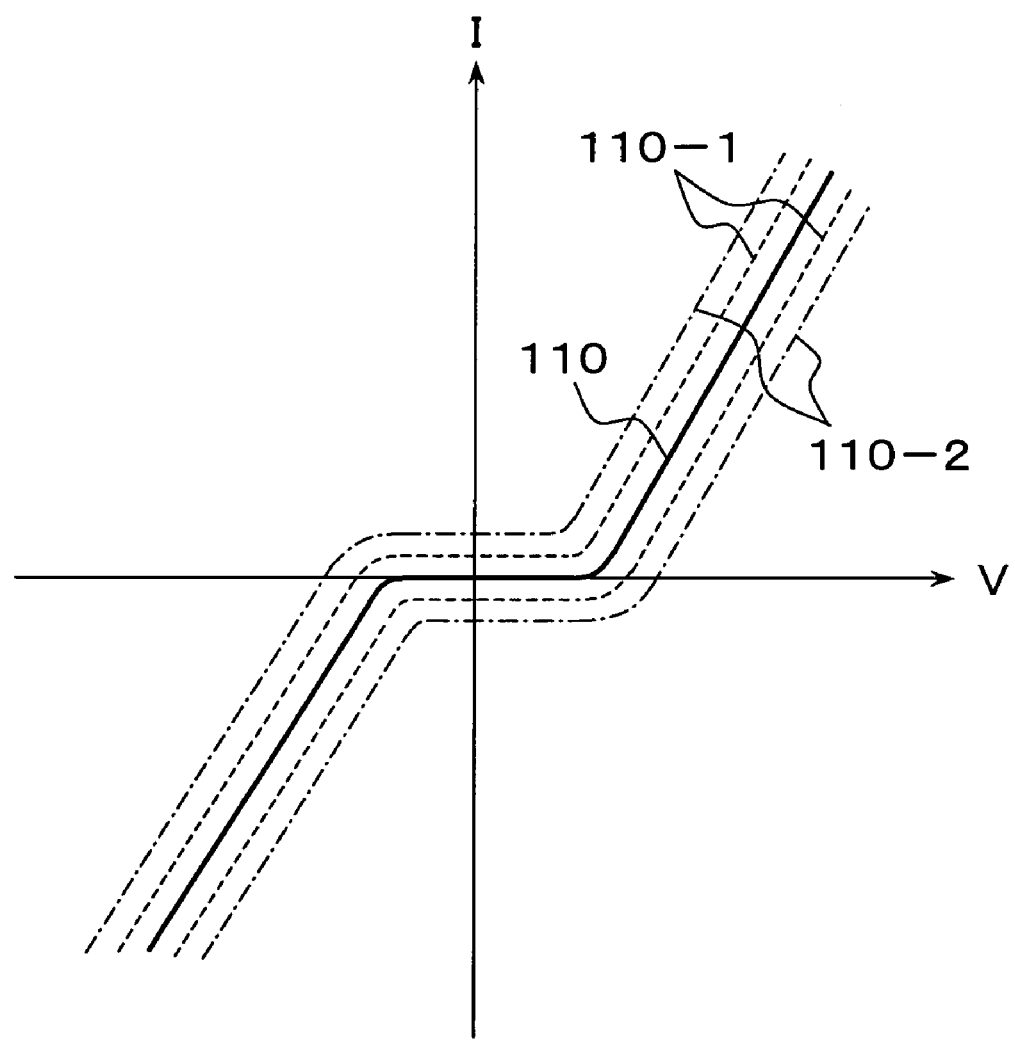
FIG. 21 is a drawing for describing analysis necessity determination for the voltage/current characteristic of the receiver in the present invention.

FIG. 21 is a drawing for describing analysis necessity determination for the voltage/current characteristic of the receiver in the present invention. For the voltage/current characteristic 110 of the receiver before change, a 90%-similarity threshold characteristic 110-1 and an 80%-similarity threshold characteristic 110-2 are set as similarity threshold characteristics. Then, as shown in a frequency range in the voltage/current-characteristic table 128 of FIG. 17 where the voltage V is in a range of 0 to the power supply voltage and the absolute value of the current I is in a range equal to or smaller than 100 mA, if the voltage/current characteristic of the receiver after change is within a range of the 90%-similarity characteristic 110-1 and is within a range of the 80%-similarity characteristic 110-2 in other portions, the receiver after change is regarded as being identical to the receiver before change, and it is decided that waveform analysis is not necessary. Here, FIGS. 20 and 21 each describe, in a characteristic graph, waveform-analysis necessity determination for the voltage/current characteristics of the driver and the receiver. Also for the transient characteristic and the frequency characteristic, waveform-analysis necessity determination is performed by, for example, setting similarity thresholds according to the transient-characteristic threshold table 130 of FIG. 18 and the frequency-characteristic threshold table 132 of FIG. 19.

Figure 22A:
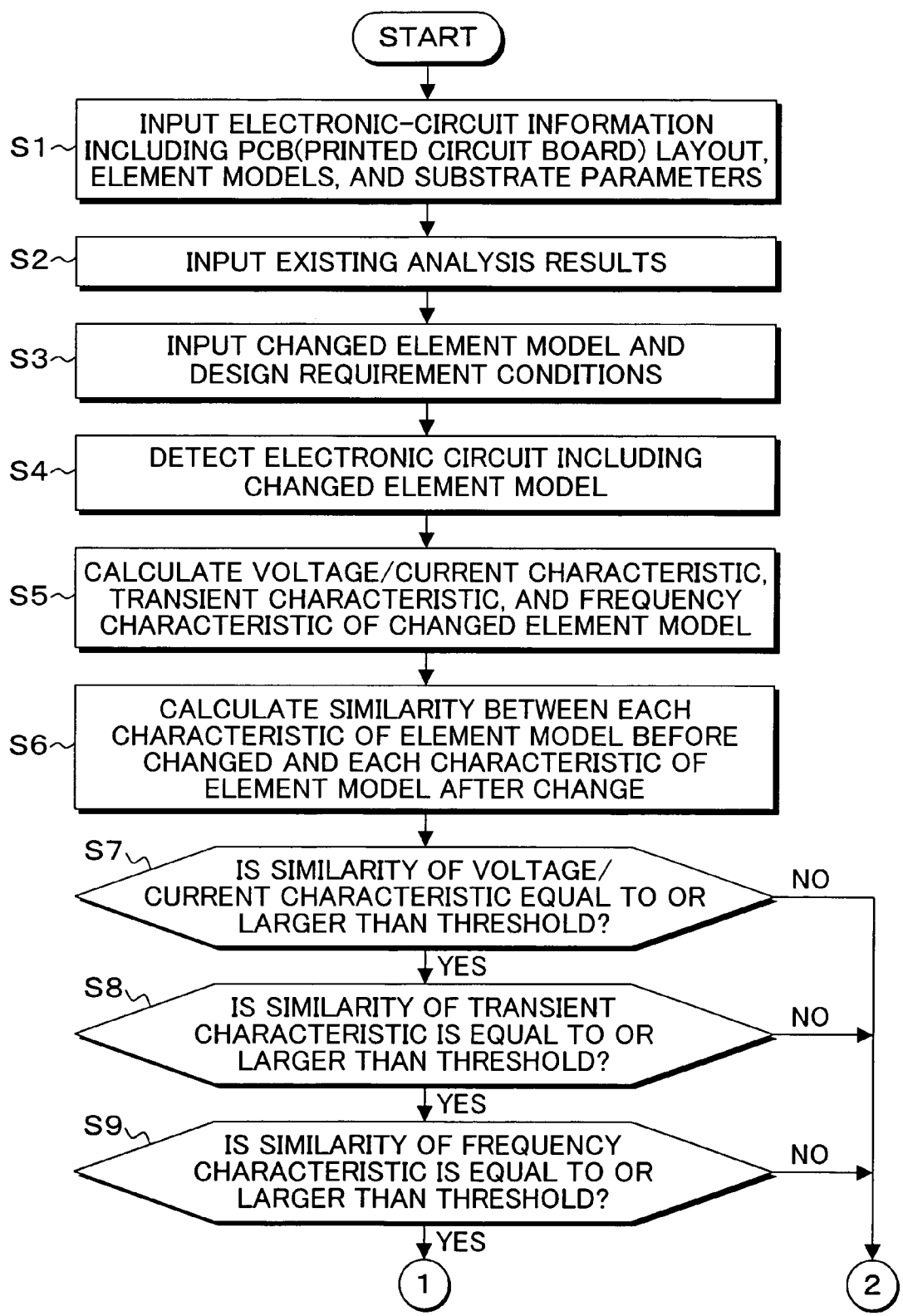
FIGS. 22A and 22B are flowcharts of an electronic-circuit analysis process according to the present invention.
Figure 22B:
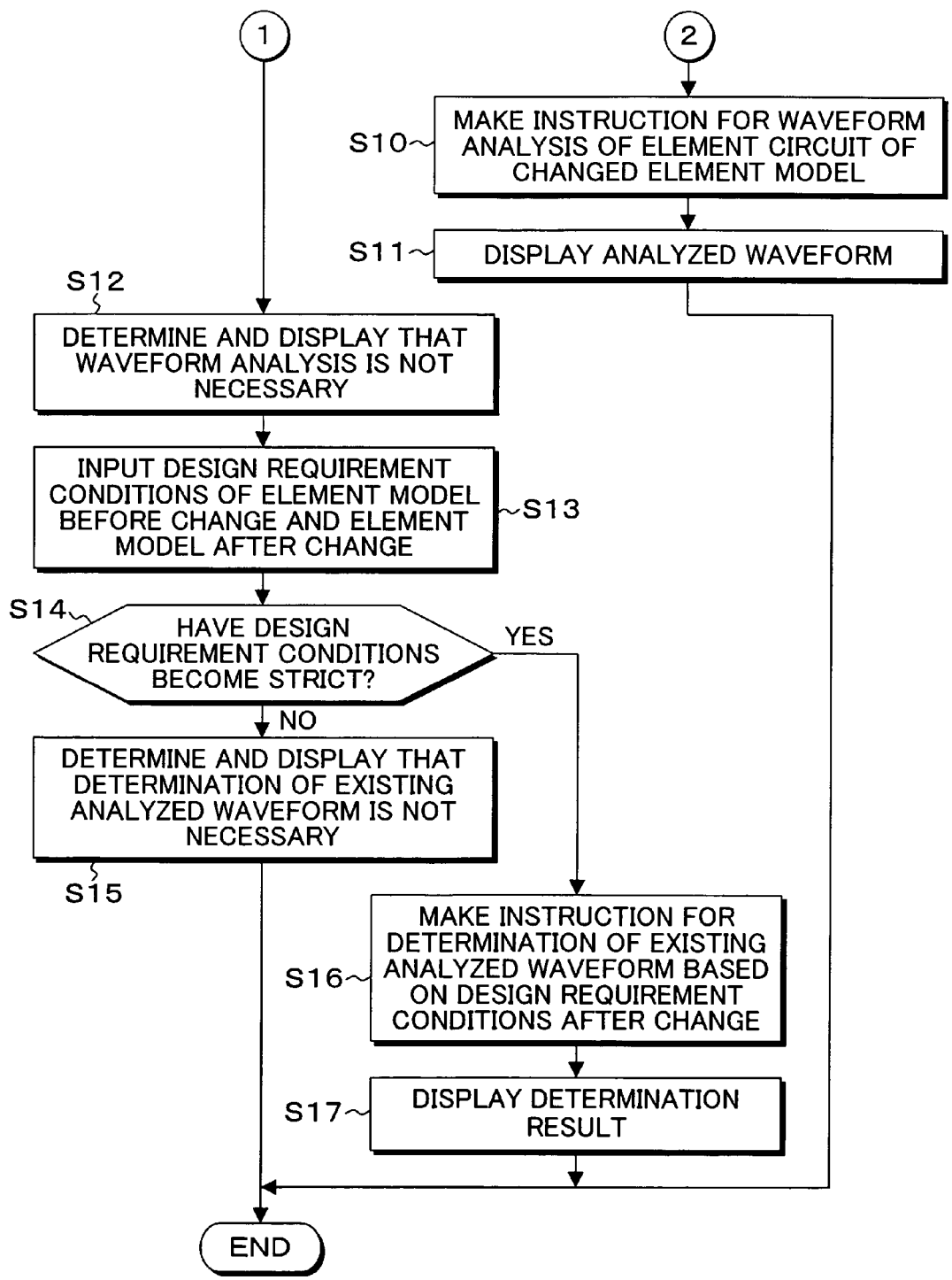

FIGS. 22A and 22B are flowcharts of an electronic-circuit analysis process according to the present invention. In FIGS. 22A and 22B, in step S1, electronic-circuit information including a board layout (PCB layout), element models, and board parameters are input from the electronic-circuit-information database 22. Then in step S2, the existing analysis results are input for each electronic circuit are input from the existing-analysis-result database 28. The existing analysis results include, in addition to the waveform analysis result, the voltage/current characteristic, transient characteristic, and frequency characteristic of the electronic circuit. Next in step S3, a changed element model is input from the design-changed-element-model database 24. Furthermore, change design conditions of the electronic circuit in association with the design-changed element model are read from the change-design-condition database 26. Then in step S4, an electronic circuit including the changed element model is detected by the design-change-target-circuit detecting unit 30. Since the electronic circuit of the present invention is targeted for the element model as shown in FIG. 6, the changed element model includes not only a driver and receiver element models but also a package equivalent circuit in association with a change of an LSI package and a transmission-path equivalent circuit in association with a change of the material property and shape of the printed circuit board. Then in step S5, a voltage/current characteristic, transient characteristic, and frequency characteristic of the changed element model are calculated by the characteristic calculating unit 36. In step S6, a similarity in characteristic between the element model before change and the element model after change is calculated. Next in step S7, it is checked whether the similarity of the voltage/current characteristic is equal to or larger than the threshold given from the determination-threshold storage unit 48. If the similarity is equal to or larger than the threshold, the procedure goes to step S8, wherein it is checked whether the similarity of the transient characteristic is equal to or larger than the threshold. If the similarity is equal to or larger than the threshold, the procedure goes to step S9, wherein it is checked whether the similarity of the frequency characteristic is equal to or larger than the threshold. If the similarity is equal to or larger than the threshold, the procedure goes to step S12. That is, when the similarities of the voltage/current characteristic, transient characteristic, and frequency characteristic are all equal to or larger than the relevant thresholds, step S12 is performed to determine that waveform analysis is not necessary and causes an indication as such to be displayed on the display unit 18. On the other hand, if the similarity of the voltage/current characteristic, transient characteristic, or frequency characteristic is smaller than the relevant threshold in any of steps S7, S8, and S9, it is determined that waveform analysis is necessary. In step S10, an instruction for waveform analysis of the electronic circuit of the changed element model is made from the waveform-analysis instructing unit 54 provided to the determination-result processing unit 52 to the analysis-model generating unit 12 and the analyzing unit 14, thereby performing an analysis through simulation of the electronic circuit including the changed model to find an analyzed waveform. Furthermore, with the results of a pass/fail determination made by the analysis-result determining unit 16 to the analyzed waveform, in step S11, the analyzed waveform and the determination result are displayed on the display unit 18. In step S12, when it is determined that waveform analysis is not necessary, the design requirement conditions of the element model before change and the element after change are input in step S13. In step S14, if the design requirement conditions of the electronic circuit using the element model after change become identical to or more relaxed than those of the electronic circuit using the element model before change, the procedure goes to step S15, wherein it is determined that a determination of the design requirement conditions of the existing analyzed waveform is not necessary, and an indication as such is displayed on the display unit 18. On the other hand, if it is determined in step S14 that the design conditions after change become stricter than those before change, the procedure goes to step S16, wherein from the waveform-determination instructing unit 56 to the analysis-result determining unit 16, an instruction for a determination of the existing analyzed waveform based on the design requirement conditions after change is made in step S16. Then in step S17, the result of the determination of the analyzed waveform complying with the changed design-change-requirement conditions is displayed. Also, the present invention provides a program for use in an electronic-circuit analysis process. The program for executing the electronic-circuit analysis process includes an execution procedure according to the procedure in the flowchart of FIGS. 22A and 22B, and is executed under the hardware environment of the computer shown in FIG. 3. Furthermore, in the above embodiment, after the characteristic of the element model after change is calculated, a similarity between the element model before change and the element model after change is calculated and, based on the similarity, it is determined whether waveform analysis is necessary by comparison with the determination threshold. Alternatively, after the characteristic of the element model is calculated, an error in characteristic between the element models before change and after change may be detected, and this error may be compared with a predetermined threshold for waveform determination to decide whether waveform determination is necessary. Still further, the present invention includes appropriate modifications without impairing the purpose or advantage of the present invention, and is not restricted by numerical values shown in the above embodiment.

What is claimed is:

1. A computer readable medium having recorded thereon a program for analyzing an electronic-circuit, wherein said program allows a computer to execute:

a circuit-information input step of inputting circuit information including an element model describing an electronic circuit;

a changed-circuit detecting step of detecting an electronic circuit using a changed element model in the circuit information;

an analysis-necessity deciding step of deciding whether waveform analysis is necessary by comparing a characteristic of an element model before change and a characteristic of the element model after change; and a determination-result processing step of displaying the result of deciding whether waveform analysis is necessary and making an instruction for waveform analysis of the electronic circuit using the element model after change for which it is determined that waveform analysis is necessary to cause the instruction to be executed;

wherein, in the analysis-necessity deciding step, a voltage/current characteristic, a transient characteristic, and a frequency characteristic are calculated as the characteristics of the element model before change and the element model after change, a similarity value of each characteristic is calculated, when the similarity values of all characteristic are equal to or larger than predetermined thresholds, it is determined that waveform analysis is not necessary, and when the similarity value of any one of the characteristics is smaller than the relevant threshold, it is determined that waveform analysis is necessary.

2. The computer readable medium according to claim 1, wherein the steps further comprises a determination-necessity deciding step of making, when it is decided in the analysis-necessity deciding step that waveform analysis is not necessary and design requirement conditions of the electronic circuit including the element model after change are changed from design requirement conditions before change, an instruction for pass/failure determination as to whether the existing waveform analysis results satisfy the design requirement conditions after change to cause the instruction to be executed, and causing the determination result to be displayed.

3. The computer readable medium according to claim 1, wherein the electronic circuit is a transmission circuit formed of a driver element of an integrated circuit implemented on a board, a transmission path disposed on the circuit board and having connected thereto an output of the driver element, and a receiver element of another integrated circuit having an input connection with the transmission path.

4. The computer readable medium according to claim 3, wherein the element model of the element circuit includes a driver element model, a transmission-path equivalent circuit model, a receiver element model, and a package equivalent circuit model of the integrated circuit.

5. The computer readable medium according to claim 1, wherein, in the analysis-necessity deciding step, a voltage/current characteristic, a transient characteristic, and a frequency characteristic are calculated as the characteristics of the element model before change and the element model after change, an error of each characteristic is calculated, when errors of all characteristics are equal to or smaller than predetermined thresholds, it is determined that waveform analysis is not necessary, and when an error of any one of the characteristics is larger than the relevant threshold, it is determined that waveform analysis is necessary.

6. The computer readable medium according to claim 2, wherein, in the analysis-necessity deciding step, when design requirement conditions of the element model after change become stricter than design requirement conditions before change, an instruction for pass/failure determination as to whether the existing waveform analysis results satisfy the design requirement conditions after change is made to cause the instruction to be executed, and the determination result is displayed.

7. An electronic-circuit analysis method, comprising:

a circuit-information input step of inputting circuit information including an element model describing an electronic circuit;

a changed-circuit detecting step of detecting an electronic circuit using a changed element model in the circuit information;

an analysis-necessity deciding step of deciding whether waveform analysis is necessary by comparing a characteristic of an element model before change and a characteristic of the element model after change; and a determination-result processing step of displaying the result of deciding whether waveform analysis is necessary and making an instruction for waveform analysis of the electronic circuit using the element model after change for which it is determined that waveform analysis is necessary to cause the instruction to be executed;

wherein, in the analysis-necessity deciding step, a voltage/current characteristic, a transient characteristic, and a frequency characteristic are calculated as the characteristics of the element model before change and the element model after change, a similarity value of each characteristic is calculated, when the similarity values of all characteristics are equal to or larger than predetermined thresholds, it is determined that waveform analysis is not necessary, and when the similarity value of any one of the characteristics is smaller than the relevant threshold, it is determined that waveform analysis is necessary.

8. The electronic-circuit analysis method according to claim 7, further comprising a determination-necessity deciding step of making, when it is decided in the analysis-necessity deciding step that waveform analysis is not necessary and design requirement conditions of the electronic circuit including the element model after change are changed from design requirement conditions before change, an instruction for pass/failure determination as to whether the existing waveform analysis results satisfy the design requirement conditions after change to cause the instruction to be executed, and causing the determination result to be displayed.

9. The electronic-circuit analysis method according to claim 7, wherein the electronic circuit is a transmission circuit formed of a driver element of an integrated circuit implemented on a board, a transmission path disposed on the circuit board and having connected thereto an output of the driver element, and a receiver element of another integrated circuit having an input connection with the transmission path.

10. The electronic-circuit analysis method according to claim 9, wherein the element model of the element circuit includes a driver element model, a transmission-path equivalent circuit model, a receiver element model, and a package equivalent circuit model of the integrated circuit.

11. The electronic-circuit analysis method according to claim 7, wherein, in the analysis-necessity deciding step, a voltage/current characteristic, a transient characteristic, and a frequency characteristic are calculated as the characteristics of the element model before change and the element model after change, an error of each characteristic is calculated, when errors of all characteristics are equal to or smaller than predetermined thresholds, it is determined that waveform analysis is not necessary, and when an error of any one of the characteristics is larger than the relevant threshold, it is determined that waveform analysis is necessary.

12. The electronic-circuit analysis method according to claim 8, wherein, in the analysis-necessity deciding step, when design requirement conditions of the element model after change become stricter than design requirement conditions before change, an instruction for pass/failure determination as to whether the existing waveform analysis results satisfy the design requirement conditions after change is made to cause the instruction to be executed, and the determination result is displayed.

13. An electronic-circuit analysis apparatus, comprising:
a circuit-information input unit that inputs circuit information including an element model describing an electronic circuit;
a changed-circuit detecting unit that detects an electronic circuit using a changed element model in the circuit information;
an analysis-necessity deciding unit that decides whether waveform analysis is necessary, by comparing a characteristic of an element model before change and a characteristic of the element model after change;
a determination-result processing unit that displays the result of deciding by the analysis-necessity deciding unit whether waveform analysis is necessary and makes an instruction for waveform analysis of the electronic circuit using the element model after change for which it is determined that waveform analysis is necessary to cause the instruction to be executed;
a determination-necessity deciding unit that makes, when it is decided by the analysis-necessity deciding unit that waveform analysis is not necessary and design requirement conditions of the electronic circuit including the element model after change are changed from design requirement conditions before change, an instruction for pass/failure determination as to whether the existing waveform analysis results satisfy the design requirement conditions after change to cause the instruction to be executed, and causes the determination result to be displayed;
wherein the analysis-necessity deciding unit calculates a voltage/current characteristic, a transient characteristic, and a frequency characteristic as the characteristics of the element model before change and the element model after change, calculates a similarity value of each characteristic, when the similarity values of all characteristics are equal to or larger than predetermined thresholds, determines that waveform analysis is not necessary, and when similarity value of any one of the characteristics is smaller than the relevant threshold, determines that waveform analysis is necessary.

14. The electronic-circuit analysis apparatus according to claim 13, wherein the electronic circuit is a transmission circuit formed of a driver element of an integrated circuit implemented on a board, a transmission path disposed on the circuit board and having connected thereto an output of the driver element, and a receiver element of another integrated circuit having an input connection with the transmission path.

15. The electronic-circuit analysis apparatus according to claim 14, wherein the element model of the element circuit includes a driver element model, a transmission-path equivalent circuit model, a receiver element model, and a package equivalent circuit model of the integrated circuit.

16. The electronic-circuit analysis apparatus according to claim 13, wherein the analysis-necessity deciding unit calculates a voltage/current characteristic, a transient characteristic, and a frequency characteristic as the characteristics of the element model before change and the element model after change, calculates an error of each characteristic, when errors of all characteristics are equal to or smaller than predetermined thresholds, determines that waveform analysis is not necessary, and when an error of any one of the characteristics is larger than the relevant threshold, determines that waveform analysis is necessary.

17. The electronic-circuit analysis apparatus according to claim 13, wherein, when design requirement conditions of the element model after change become stricter than design requirement conditions before change, the analysis-necessity deciding unit makes an instruction for pass/failure determination as to whether the existing waveform analysis results satisfy the design requirement conditions after change to cause the instruction to be executed, and causes the determination result to be displayed.

* * * * *